(12) United States Patent
Koo et al.

(10) Patent No.: US 11,360,159 B2
(45) Date of Patent: Jun. 14, 2022

(54) METHOD FOR INSPECTING INSERTION STATES OF PINS INSERTED INTO SUBSTRATE, AND SUBSTRATE INSPECTION APPARATUS

(71) Applicant: KOH YOUNG TECHNOLOGY INC., Seoul (KR)

(72) Inventors: Dae Sung Koo, Seoul (KR); Woo Young Lim, Goyang-si Gyeonggi-do (KR); Yong Kim, Seoul (KR)

(73) Assignee: KOH YOUNG TECHNOLOGY INC., Seoul (KR)

( * ) Notice: Subject to any disclaimer, the term of this patent is extended or adjusted under 35 U.S.C. 154(b) by 144 days.

(21) Appl. No.: 16/957,321

(22) PCT Filed: Dec. 28, 2018

(86) PCT No.: PCT/KR2018/016882
§ 371 (c)(1),
(2) Date: Jun. 23, 2020

(87) PCT Pub. No.: WO2019/132599
PCT Pub. Date: Jul. 4, 2019

(65) Prior Publication Data
US 2020/0348367 A1 Nov. 5, 2020

(30) Foreign Application Priority Data

Dec. 28, 2017 (KR) .................... 10-2017-0182877
Dec. 27, 2018 (KR) .................... 10-2018-0170537

(51) Int. Cl.
*G01R 31/66* (2020.01)

(52) U.S. Cl.
CPC .................... *G01R 31/66* (2020.01)

(58) Field of Classification Search
CPC ...... G01R 31/66; H05K 13/0815; H05K 1/02; H05K 1/0268; H05K 2203/162; G01N 21/956; G01N 2021/95661
See application file for complete search history.

(56) References Cited

U.S. PATENT DOCUMENTS 4,827,436 A * 5/1989 Sabersky ............. G01B 11/028
  250/559.36
5,052,816 A * 10/1991 Nakamura ............. G01N 25/72
  374/5

(Continued)

FOREIGN PATENT DOCUMENTS

CN 101889486 11/2010
CN 102203840 9/2011

(Continued)

OTHER PUBLICATIONS

International Search report, with English translation, corresponding to International Application No. PCT/KR2018/016882, dated Apr. 1, 2019.

(Continued)

*Primary Examiner* — Akm Zakaria
(74) *Attorney, Agent, or Firm* — Kile Park Reed & Houtteman PLLC

(57) ABSTRACT

A substrate inspection apparatus may include a communication circuit, a plurality of light sources, an image sensor, at least one memory, and at least one processor. The processor may be configured to generate pin insertion state information indicating an insertion state of each of a plurality of first pins by using a pattern light reflected from each of the plurality of first pins, detect at least one second pin having an insertion defect from among the plurality of first pins by using at least one of the pin insertion reference information and the pin insertion state information of each of the plurality of first pins, generate a control signal for (Continued)

adjusting at least one first process parameter among a plurality of process parameters of the pin insertion apparatus, and control the communication circuit to transmit the control signal to the pin insertion apparatus.

20 Claims, 19 Drawing Sheets

(56) References Cited

U.S. PATENT DOCUMENTS

| | | | | |
|---|---|---|---|---|
| 5,058,177 | A | * 10/1991 | Chemaly | G06T 7/0006 |
| | | | | 382/149 |
| 5,729,346 | A | 3/1998 | Joo | |
| 2005/0084148 | A1 | 4/2005 | Miranda | |
| 2006/0073737 | A1 | 4/2006 | Lorenzen | |
| 2010/0155574 | A1 | 6/2010 | Choi et al. | |
| 2010/0306998 | A1* | 12/2010 | Nolleck | H05K 13/082 |
| | | | | 29/842 |
| 2011/0205716 | A1 | 8/2011 | Moriwaki | |
| 2014/0255089 | A1 | 9/2014 | De France | |
| 2018/0301369 | A1* | 10/2018 | Matsuura | H01L 21/6719 |

FOREIGN PATENT DOCUMENTS

| | | |
|---|---|---|
| CN | 103827514 | 5/2014 |
| JP | 05-180780 | 7/1993 |
| JP | 05-275900 | 10/1993 |
| JP | 08-014855 | 1/1996 |
| JP | 2001-280935 | 10/2001 |
| JP | 2005-128016 | 5/2005 |
| JP | 2005-252290 | 9/2005 |
| JP | 2008-76107 | 4/2008 |

OTHER PUBLICATIONS

Written Opinion, with English translation, corresponding to International Application No. PCT/KR2018/016882, dated Apr. 1, 2019.
Korean Office Action, with English translation, corresponding to Korean Application No. 10-2018-0170537, dated Aug. 26, 2019.
Extended European Search Report, corresponding to European Application No./Patent No. 18896171.8, dated Jan. 19, 2021.
European Office Action for European Application No. 18 896 171.8, dated Nov. 5, 2021.
Chinese Office Action with English Translation for Chinese Application or Patent No. 201880078897.6, dated Dec. 2, 2021.

* cited by examiner

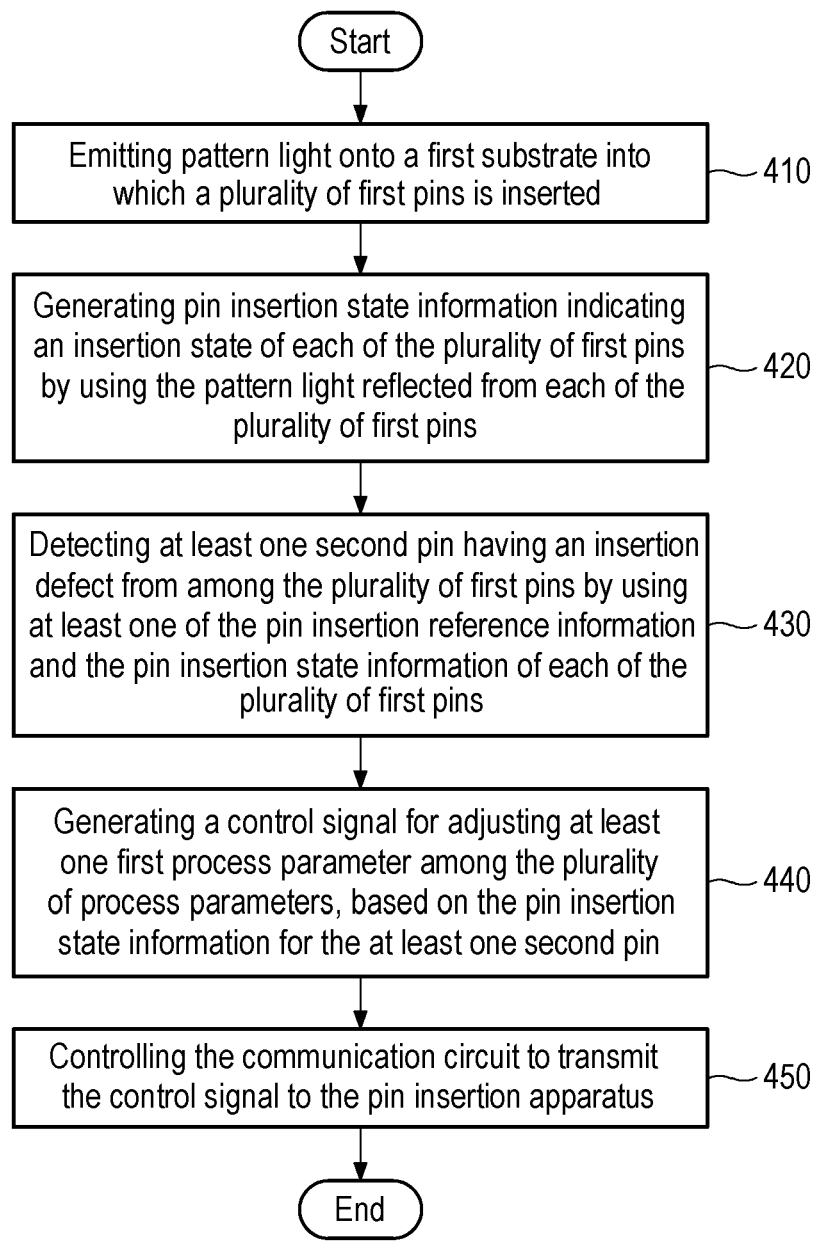

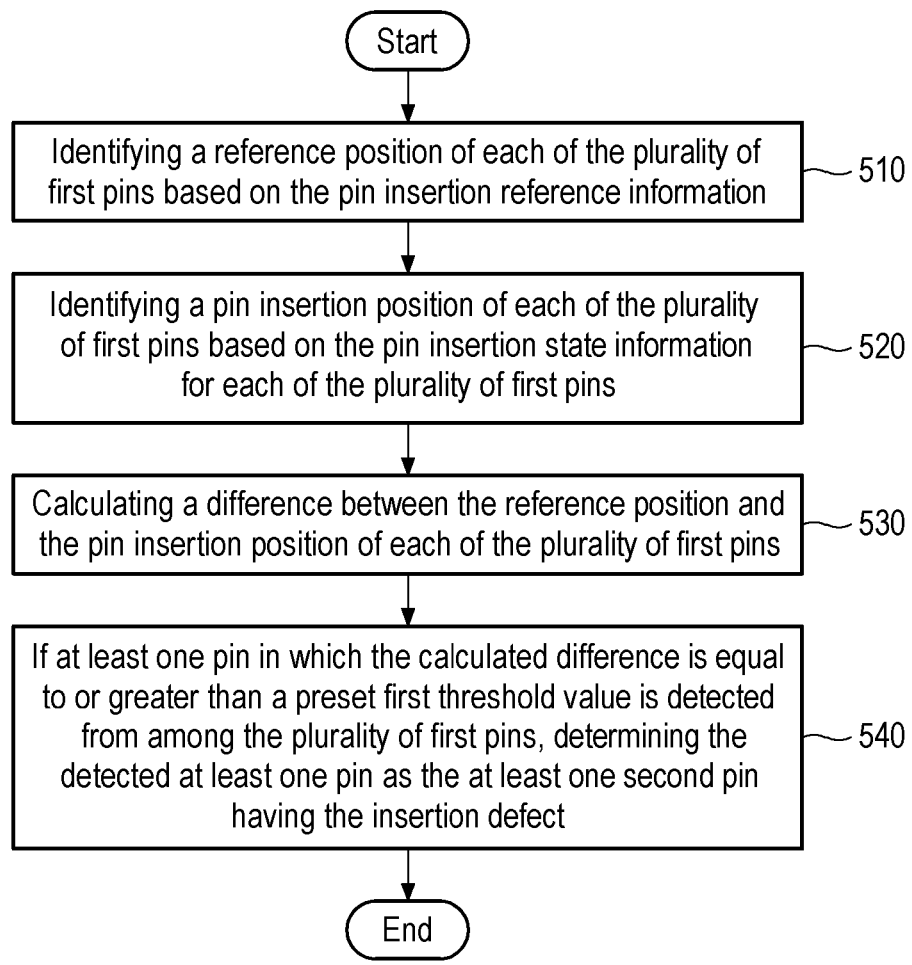

METHOD FOR INSPECTING INSERTION STATES OF PINS INSERTED INTO SUBSTRATE, AND SUBSTRATE INSPECTION APPARATUS

TECHNICAL FIELD

The present disclosure relates to a method for inspecting insertion states of a plurality of pins inserted into a substrate, and a substrate inspection apparatus.

BACKGROUND

Generally, a pin insertion apparatus inserts a plurality of pins into a plurality of holes formed on a substrate, for example, a printed circuit board (PCB). The substrate into which the plurality of pins is inserted may be electrically connected to another component or substrate by using at least one of the plurality of inserted pins. Specifically, the pin insertion apparatus moves a pin insertion head loaded with a plurality of pins to a preset pin insertion position, and then applies a pin insertion force to a pin insertion finger, whereby the pin insertion finger presses and inserts the pin loaded on the pin insertion head into a hole formed in the substrate.

However, due to the characteristics of the pins to be inserted, the setting error of the pin insertion apparatus, the mechanical play and defect of the pin insertion apparatus, the non-planarity of the substrate, and the like, an error may occur in the pin insertion process performed by the pin insertion apparatus. Due to this, an insertion defect may occur in the pin or connector inserted into the substrate.

It is time-consuming and costly for a user to directly inspect the insertion state of the pin in order to detect such an insertion defect of the pin. Moreover, the inspection may not be accurately performed. In addition, it is also time-consuming and costly for a user to directly take measures with respect to the pin insertion apparatus in order to improve the insertion defect of the pin, which may lead to the problem that the productivity is deteriorated.

SUMMARY

Various embodiments of the present disclosure provide a substrate inspection apparatus capable of emitting pattern light on a substrate into which a plurality of pins is inserted, inspecting an insertion state of the plurality of pins, and adjusting process parameters of a pin insertion apparatus according to the insertion state of a pin having an insertion defect.

Various embodiments of the present disclosure provide a method capable of emitting pattern light on a substrate into which a plurality of pins is inserted, inspecting an insertion state of the plurality of pins, and adjusting process parameters of a pin insertion apparatus according to the insertion state of a pin having an insertion defect.

According to various embodiments of the present disclosure, a substrate inspection apparatus for inspecting an insertion state of a plurality of pins inserted into a substrate may include: a communication circuit configured to communicate with a pin insertion apparatus for inserting the pins into the substrate; a plurality of light sources configured to emit pattern light onto a first substrate into which a plurality of first pins is inserted by the pin insertion apparatus; an image sensor configured to receive the pattern light reflected from each of the plurality of first pins; at least one memory configured to store pin insertion reference information indicating a reference height and a reference position set for each of the plurality of first pins; and at least one processor. The processor may be configured to: generate pin insertion state information indicating an insertion state of each of the plurality of first pins by using the pattern light reflected from each of the plurality of first pins received by the image sensor; detect at least one second pin having an insertion defect from among the plurality of first pins by using at least one of the pin insertion reference information and the pin insertion state information of each of the plurality of first pins; generate a control signal for adjusting at least one first process parameter among a plurality of process parameters of the pin insertion apparatus, based on the pin insertion state information for the at least one second pin; and control the communication circuit to transmit the control signal to the pin insertion apparatus.

In one embodiment, the pin insertion state information may include information indicating a pin tip height, information indicating a pin shoulder height, information indicating a pin tip position, and information indicating a pin insertion position.

In one embodiment, the plurality of process parameters may include a process parameter for adjusting a pin insertion force, a process parameter for adjusting a pin insertion position, a process parameter for adjusting a pin insertion speed, a process parameter for adjusting a movement speed of a pin insertion head used for pin insertion, and a process parameter for adjusting a position of an anvil.

In one embodiment, the processor may be configured to: identify a reference position of each of the plurality of first pins based on the pin insertion reference information; identify a pin insertion position of each of the plurality of first pins based on the pin insertion state information; calculate a difference between the reference position and the pin insertion position of each of the plurality of first pins; and if at least one pin in which the calculated difference is equal to or greater than a preset first threshold value is detected from among the plurality of first pins, determine the detected at least one pin as the at least one second pin having the insertion defect.

In one embodiment, the processor may be configured to: determine at least one process parameter available for adjusting the difference between the reference position and the pin insertion position of the at least one second pin among the plurality of process parameters, as the at least one first process parameter; and generate the control signal for adjusting the at least one first process parameter such that the difference between the reference position and the pin insertion position of the at least one second pin becomes less than the first threshold value.

In one embodiment, the processor may be configured to: calculate a difference between a pin tip position and a pin insertion position of each of the plurality of first pins identified based on the pin insertion state information; and if at least one pin in which the calculated difference is equal to or greater than a preset second threshold value is detected from among the plurality of first pins, determine the detected at least one pin as the at least one second pin having the insertion defect.

In one embodiment, the processor may be configured to: determine at least one process parameter available for adjusting the difference between the reference position and the pin insertion position of the at least one second pin among the plurality of process parameters, as the at least one first process parameter; and generate the control signal for adjusting the at least one first process parameter such that the difference between the reference position and the pin insertion position of the at least one second pin becomes less than the second threshold value.

In one embodiment, the processor may be configured to: identify a reference height of each of the plurality of first pins based on the pin insertion reference information; identify a pin tip height of each of the plurality of first pins based on the pin insertion state information; calculate a difference between the reference height and the pin tip height of each of the plurality of first pins; and if at least one pin in which the calculated difference is equal to or greater than a preset third threshold value is detected from among the plurality of first pins, determine the detected at least one pin as the at least one second pin having an insertion defect.

In one embodiment, the processor may be configured to: determine at least one process parameter available for adjusting the difference between the reference height and the pin tip height of the at least one second pin among the plurality of process parameters, as the at least one first process parameter; and generate the control signal for adjusting the at least one first process parameter such that the difference between the reference height and the pin tip height of the at least one second pin becomes less than the third threshold value.

In one embodiment, the processor may be configured to: calculate a shoulder coplanarity of each of the plurality of first pins by using a pin shoulder height of each of the plurality of first pins identified based on the pin insertion state information; and if at least one pin in which the calculated shoulder coplanarity is equal to or greater than a preset fourth threshold value is detected from among the plurality of first pins, determine the detected at least one pin as the at least one second pin having the insertion defect.

In one embodiment, the processor may be configured to: determine at least one process parameter available for adjusting the shoulder coplanarity of the at least one second pin among the plurality of process parameters, as the at least one first process parameter; and generate a control signal for adjusting the at least one first process parameter such that the shoulder coplanarity of the at least one second pin becomes less than the fourth threshold value.

According to various embodiments of the present disclosure, a method for inspecting an insertion state of a plurality of pins inserted into a substrate by a substrate inspection apparatus may include: emitting pattern light onto a first substrate into which a plurality of first pins is inserted by a pin insertion apparatus; receiving the pattern light reflected from each of the plurality of first pins; generating pin insertion state information indicating an insertion state of each of the plurality of first pins by using the pattern light reflected and received from each of the plurality of first pins; detecting at least one second pin having an insertion defect from among the plurality of first pins by using at least one of pin insertion reference information indicating a reference height and a reference position set for each of the plurality of first pins and the pin insertion state information of each of the plurality of first pins; generating a control signal for adjusting at least one first process parameter among a plurality of process parameters of the pin insertion apparatus, based on the pin insertion state information for the at least one second pin; and transmitting the control signal to the pin insertion apparatus.

In one embodiment, the step of detecting at least one second pin having an insertion defect may include: identifying a reference position of each of the plurality of first pins based on the pin insertion reference information; identifying a pin insertion position of each of the plurality of first pins based on the pin insertion state information; calculating a difference between the reference position and the pin insertion position of each of the plurality of first pins; and if at least one pin in which the calculated difference is equal to or greater than a preset first threshold value is detected from among the plurality of first pins, detecting the detected at least one pin as the at least one second pin having an insertion defect.

In one embodiment, the step of generating a control signal for adjusting at least one first process parameter may include: determining at least one process parameter available for adjusting the difference between the reference position and the pin insertion position of the at least one second pin among the plurality of process parameters, as the at least one first process parameter; and generating the control signal for adjusting the at least one first process parameter such that the difference between the reference position and the pin insertion position of the at least one second pin becomes less than the first threshold value.

In one embodiment, the step of detecting at least one second pin having an insertion defect may include: calculating a difference between a pin tip position and a pin insertion position of each of the plurality of first pins identified based on the pin insertion state information; and if at least one pin in which the calculated difference is equal to or greater than a preset second threshold value is detected from among the plurality of first pins, detecting the detected at least one pin as the at least one second pin having an insertion defect.

In one embodiment, the step of generating a control signal for adjusting at least one first process parameter may include: determining at least one process parameter available for adjusting the difference between the pin tip position and the pin insertion position of the at least one second pin among the plurality of process parameters, as the at least one first process parameter; and generating a control signal for adjusting the at least one first process parameter such that the difference between the pin tip position and the pin insertion position of the at least one second pin becomes less than the second threshold value.

In one embodiment, the step of detecting at least one second pin having an insertion defect may include: identifying a reference height of each of the plurality of first pins based on the pin insertion reference information; identifying a pin tip height of each of the plurality of first pins based on the pin insertion state information; calculating a difference between the reference height and the pin tip height of each of the plurality of first pins; and if at least one pin in which the calculated difference is equal to or greater than a preset third threshold value is detected from among the plurality of first pins, detecting the detected at least one pin as the at least one second pin having an insertion defect.

In one embodiment, the step of generating a control signal for adjusting at least one first process parameter may include: determining at least one process parameter available for adjusting the difference between the reference height and the pin tip height of the at least one second pin among the plurality of process parameters, as the at least one first process parameter; and generating a control signal for adjusting the at least one first process parameter such that the difference between the reference height and the pin tip height of the at least one second pin becomes less than the third threshold value.

In one embodiment, the step of detecting at least one second pin having an insertion defect may include: calculating a shoulder coplanarity of each of the plurality of first pins by using a pin shoulder height of each of the plurality of first pins identified based on the pin insertion state information; and if at least one pin in which the calculated shoulder coplanarity is equal to or greater than a preset fourth threshold value is detected from among the plurality of first pins, detecting the detected at least one pin as the at least one second pin having an insertion defect.

In one embodiment, the step of generating a control signal for adjusting at least one first process parameter may include: determining at least one process parameter available for adjusting the shoulder coplanarity of the at least one second pin among the plurality of process parameters, as the at least one first process parameter; and generating a control signal for adjusting the at least one first process parameter such that the shoulder coplanarity of the at least one second pin becomes less than the fourth threshold value.

According to the present disclosure in some embodiments, the substrate inspection apparatus may emit pattern light on a substrate into which a plurality of pins is inserted, may detect at least one pin having a defect among the plurality of pins by using the pattern light reflected from the plurality of pins, and may control a pin insertion apparatus, by using the insertion state information of the at least one pin thus detected, so as to adjust at least one process parameter among a plurality of process parameters of the pin insertion apparatus. This makes it possible to quickly and accurately inspect the insertion state of the plurality of pins inserted into the substrate, and to efficiently control the pin insertion apparatus so as to improve the insertion defect.

BRIEF DESCRIPTION OF DRAWINGS

FIG. 4 is a flowchart of a method for inspecting an insertion state of a plurality of pins by the substrate inspection apparatus according to various embodiments of the present disclosure.

FIG. 5 is a flowchart of a method for detecting at least one second pin having an insertion defect by using a pin insertion position according to various embodiments of the present disclosure.

DETAILED DESCRIPTION

Figure 1:
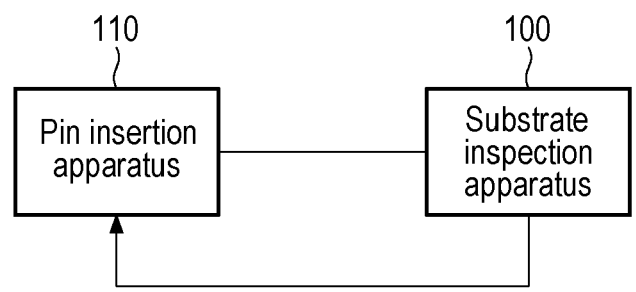
FIG. 1 is a view for explaining a method of controlling a pin insertion apparatus by a substrate inspection apparatus according to various embodiments of the present disclosure.

Embodiments of the present disclosure are illustrated for describing the technical spirit of the present disclosure. The scope of the claims according to the present disclosure is not limited to the embodiments described below or to the detailed descriptions of these embodiments.

All technical or scientific terms used herein have meanings that are generally understood by a person having ordinary knowledge in the art to which the present disclosure pertains, unless otherwise specified. The terms used herein are selected only for more clear illustration of the present disclosure, and are not intended to limit the scope of claims in accordance with the present disclosure.

The expressions "include", "provided with", "have" and the like used herein should be understood as open-ended terms connoting the possibility of inclusion of other embodiments, unless otherwise mentioned in a phrase or sentence including the expressions.

A singular expression can include meanings of plurality, unless otherwise mentioned, and the same applies to a singular expression stated in the claims.

The terms "first", "second", etc. used herein are used to identify a plurality of components from one another, and are not intended to limit the order or importance of the relevant components.

The expression "based on" used herein is used to describe one or more factors that influences a decision, an action of judgment or an operation described in a phrase or sentence including the relevant expression, and this expression does not exclude additional factors influencing the decision, the action of judgment or the operation.

When a certain component is described as "coupled to" or "connected to" another component, this should be understood as having the meaning that the certain component may be coupled or connected directly to the other component or that the certain component may be coupled or connected to the other component via a new intervening component.

Hereinafter, embodiments of the present disclosure will be described with reference to the accompanying drawings. In the accompanying drawings, identical or corresponding components are indicated by identical reference numerals. In the following description of embodiments, repeated descriptions of the identical or corresponding components will be omitted. However, even if a description of a component is omitted, such a component is not intended to be excluded in an embodiment.

Although process steps, method steps, algorithms, etc. are illustrated in a sequential order in the flowchart shown in the present disclosure, such processes, methods, and algorithms may be configured to be operated in any suitable order. In other words, the steps in the processes, methods, and algorithms explained in various embodiments of the present disclosure are not necessarily performed in the order described in the present disclosure. Further, even though some steps are explained as being performed non-simultaneously, such steps may be simultaneously performed in another embodiment. Moreover, the illustration of the processes depicted in the figure does not mean that the illustrated processes exclude other changes and modifications thereto, that any of the illustrated processes or the steps thereof are essential for at least one of various embodiments of the present disclosure, and that the illustrated processes are desirable.

FIG. 1 is a view for explaining a method of controlling a pin insertion apparatus by a substrate inspection apparatus according to various embodiments of the present disclosure. According to various embodiments of the present disclosure, the substrate inspection apparatus 100 may perform inspection of a substrate into which a plurality of pins is inserted by a pin insertion apparatus 110. For example, the pin insertion apparatus 110 may perform a process of inserting a plurality of pins into the substrate, and may transfer the substrate into which the plurality of pins is inserted, to the substrate inspection apparatus 100. The substrate inspection apparatus 100 may inspect the insertion state of each of the plurality of pins inserted into the substrate transferred from the pin insertion apparatus 110. The substrate inspection apparatus 100 may emit pattern light on the substrate and may receive the pattern light reflected from each of the plurality of pins inserted into the substrate. The substrate inspection apparatus 100 may measure a height, an insertion position and the like of each of the plurality of pins by using the received pattern light, and may inspect the insertion state of each of the plurality of pins by using the measurement information. A specific method for inspecting the insertion state of each of the plurality of pins by the substrate inspection apparatus 100 will be described later.

According to various embodiments of the present disclosure, the substrate inspection apparatus 100 may control the pin insertion apparatus 110 by using the inspection result for each of the plurality of pins inserted into the substrate. For example, the substrate inspection apparatus 100 may generate a control signal for adjusting at least one process parameter among a plurality of process parameters related to the pin insertion process of the pin insertion apparatus 110 by using the inspection result. The substrate inspection apparatus 100 may control the pin insertion apparatus 110 by transmitting the generated control signal to the pin insertion apparatus 110 so that the pin insertion apparatus 110 can adjust at least one process parameter according to the received control signal. A specific method for generating the control signal for adjusting at least one process parameter by the substrate inspection apparatus 100 will be described later.

As described above, the substrate inspection apparatus 100 may quickly and accurately inspect an insertion state of the plurality of pins inserted into the substrate by using the information measured using the pattern light. In addition, the substrate inspection apparatus 100 may use the inspection result to efficiently control the pin insertion apparatus 110 to improve the insertion defect caused by an error of the pin insertion apparatus 110.

Figure 2:
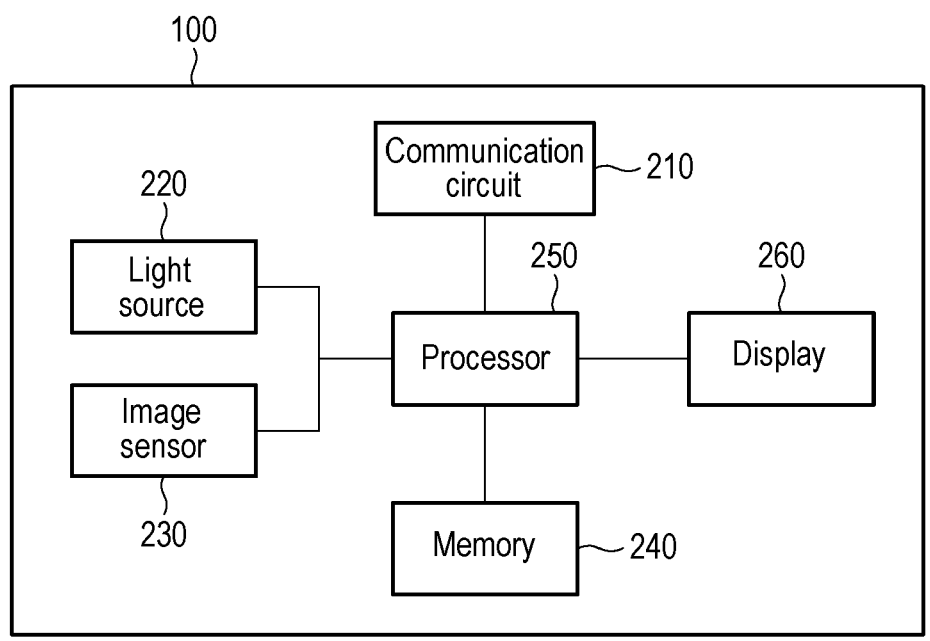
FIG. 2 is a block diagram of the substrate inspection apparatus according to various embodiments of the present disclosure.

FIG. 2 is a block diagram of the substrate inspection apparatus 100 according to various embodiments of the present disclosure. According to various embodiments of the present disclosure, the substrate inspection apparatus 100 may include a communication circuit 210, a memory 240, a light source 220, an image sensor 230 and a processor 250. In addition, the substrate inspection apparatus 100 may further include a display 260. The components included in the substrate inspection apparatus 100 are electrically connected to each other to transmit and receive signals and data. Hereinafter, for the sake of convenience of description, each of the components included in the substrate inspection apparatus 100 is expressed in a singular form. However, the present disclosure is not limited thereto. Each of the components may be plural.

In one embodiment, the communication circuit 210 may communicate with an external electronic device or an external server. For example, the communication circuit 210 may establish communication between the substrate inspection apparatus 100 and the pin insertion apparatus 110 for inserting a pin into a substrate. The communication circuit 210 may be connected to a network through wireless communication or wired communication to communicate with an external electronic device or an external server. As another example, the communication circuit 210 may be connected to an external electronic device in a wired manner to perform communication.

The wireless communication may include, for example, cellular communication (e.g., LTE, LTE Advance (LTE-A), Code Division Multiple Access (CDMA), Wideband CDMA (WCDMA), Universal Mobile Telecommunications System (UMTS), Wireless Broadband (WiBro), and the like). Furthermore, the wireless communication may include short-range wireless communication (e.g., Wireless Fidelity (WiFi), Light Fidelity (LiFi), Bluetooth, Bluetooth Low Power (BLE), Zigbee, Near Field Communication (NFC), the like).

In one embodiment, the light source 220 may emit pattern light on an inspection target (e.g., a substrate). The light source 220 may emit the pattern light on the entire inspection target, or may emit the pattern light on at least one object (e.g., a pin inserted into the substrate) included in the inspection target. For example, the light source 220 may include a grating (not shown), a grating transfer device (not shown), and a projection lens part (not shown). The grating may convert the light emitted from the light source 220 into pattern light. The grating may be transferred by a grating transfer mechanism, for example a piezo actuator (PZT), to generate phase-shifted pattern light. The projection lens part may allow the pattern light generated by the grating to be emitted on the inspection target.

As another example, the light source 220 may include Digital Light Processing (DLP) or Liquid Crystal on Silicon (LCoS). The DLP or LCoS may convert light emitted from the light source 220 into pattern light so that the pattern light can be emitted on the inspection target.

For example, the light source 220 may emit pattern light on a first substrate into which a plurality of first pins is inserted. The pattern light may be light having a pattern of a constant or specific period, which is emitted to measure a three-dimensional shape of the inspection target. The light source 220 may emit pattern light in which the brightness of stripes has a sine wave shape, on-off type pattern light in which bright and dark portions are repeatedly displayed, triangular-wave pattern light in which the change in brightness is a triangular waveform, or the like. However, this is merely for description purposes, and the present disclosure is not limited thereto. The light source 220 may emit various types of pattern light in which the change in brightness is repeated at a constant or specific period.

Furthermore, the light source 220 may emit first-wavelength light, second-wavelength light, and third-wavelength light on the inspection target. The light source 220 may emit first-wavelength light, second-wavelength light and third-wavelength light on the entire inspection target or at least one object included in the inspection target. For example, the light source 220 may emit first-wavelength light, second-wavelength light, and third-wavelength light on a first substrate into which a plurality of first pins is inserted.

In one embodiment, the light source 220 may sequentially emit first-wavelength light, second-wavelength light, and third-wavelength light, or may simultaneously emit at least two kinds of light. For example, the first-wavelength light may be red light, the second-wavelength light may be green light, and the third-wavelength light may be blue light. However, this is merely for description purposes, and the present disclosure is not limited thereto. The first-wavelength light, the second-wavelength light and the third-wavelength light may be light having different wavelengths.

Hereinafter, for the sake of convenience of description, there will be mainly described a case where the light source 220 emits pattern light. However, the present disclosure is not limited thereto. The light source 220 may additionally emit first-wavelength light, second-wavelength light, and third-wavelength light, or may emit the pattern light, the first-wavelength light, the second-wavelength light and the third-wavelength light.

In one embodiment, the image sensor 230 may receive the pattern light reflected from each of a plurality of pins inserted into the substrate. For example, the image sensor 230 may receive the pattern light reflected from each of a plurality of first pins inserted into a first substrate, and may use the received pattern light to generate an image (e.g., a three-dimensional image) for each of the plurality of first pins.

Furthermore, the image sensor 230 may receive first-wavelength light, second-wavelength light and third-wavelength light, which are reflected from each of the plurality of pins inserted into the substrate. For example, when first-wavelength light, second-wavelength light and third-wavelength light are emitted from the light source 220 on the first substrate, the image sensor 230 may receive the first-wavelength light, the second-wavelength light and the third-wavelength light reflected from each of a plurality of first pins inserted into a first substrate, and may use the received first-wavelength light, the received second-wavelength light and the received third-wavelength light to generate an image (e.g., a two-dimensional image) for each of the plurality of first pins. The image sensor 230 may transmit the generated image for each of the plurality of first pins to the processor 250. In addition, the image sensor 230 may include a plurality of image sensors that can receive light in the same direction or different directions.

For example, the image sensor 230 may include a Charge Coupled Device (CCD) camera, a Complementary Metal Oxide Semiconductor (CMOS) camera, or the like. However, this is merely for description purposes, and the present disclosure is not limited thereto.

In one embodiment, the memory 240 may store instructions or data related to at least one other component of the substrate inspection apparatus 100. Furthermore, the memory 240 may store software and/or programs. For example, the memory 240 may include an internal memory or an external memory. The internal memory may include at least one of a volatile memory (e.g., a DRAM, an SRAM or an SDRAM), and a non-volatile memory (e.g., a flash memory, a hard drive or a solid state drive (SSD)). The external memory may be functionally or physically connected to the substrate inspection apparatus 100 through various interfaces.

In one embodiment, the memory 240 may store instructions for causing the processor 250 to operate. For example, the memory 240 may store instructions that cause the processor 250 to control other components of the substrate inspection apparatus 100 and to interwork with an external electronic device or server. The processor 250 may control other components of the substrate inspection apparatus 100 based on the instructions stored in the memory 240, and may interwork with an external electronic device or server. Hereinafter, the operation of the substrate inspection apparatus 100 will be described by focusing on the respective components of the substrate inspection apparatus 100. In addition, instructions for causing the respective components to perform operations may be stored in the memory 240.

In one embodiment, the memory 240 may store pin insertion reference information indicating a reference height and a reference position set for each of the plurality of first pins inserted into the first substrate. The reference height and the reference position set for the respective first pins may be used to determine insertion defect of the respective first pins. The pin insertion reference information may be set according to design information of the first substrate or a user input.

Furthermore, the memory 240 may further store information about a plurality of process parameters related to the pin insertion process of the pin insertion apparatus 110 and information about values of a plurality of process parameters used in the pin insertion process performed on the first substrate by the pin insertion apparatus 110. The information about the plurality of process parameters and the information about the values of the plurality of process parameters may be received from the pin insertion apparatus 110 and stored in the memory 240, or may be generated by a user input and stored in the memory 240.

For example, the information about the plurality of process parameters may include information indicating whether each of the plurality of process parameters can affect a pin insertion position, a pin bending, an inserted pin height, a shoulder coplanarity of an inserted pin, a pin insertion angle, or the like. For example, it may be confirmed by using the information about the plurality of process parameters that a specific process parameter can affect a pin insertion position but cannot affect an inserted pin height and a shoulder coplanarity of an inserted pin. However, this is merely for description purposes, and the present disclosure is not limited thereto. One process parameter may affect at least two of a pin insertion position, a pin bending, an inserted pin height, a shoulder coplanarity of an inserted pin and a pin insertion angle.

The information about the values of the plurality of process parameters may be used to determine how much to adjust at least one process parameter to be adjusted, when the adjusting of at least one process parameter among the plurality of process parameters is needed to improve an insertion defect.

For example, the plurality of process parameters related to the pin insertion process may include at least two of a process parameter for adjusting a pin insertion force, a process parameter for adjusting a pin insertion position, a process parameter for adjusting a pin insertion speed, a process parameter for adjusting a movement speed of a pin insertion head used for pin insertion and a process parameter for adjusting a position of an anvil. However, this is merely for description purposes, and the present disclosure is not limited thereto. The plurality of process parameters may include various parameters related to the pin insertion process of the pin insertion apparatus 110.

In one embodiment, the processor 250 may drive an operating system or an application program to control at least one other component of the substrate inspection apparatus 100, and may perform various data processing processes, calculation processes, and the like. For example, the processor 250 may include a central processing unit or the like, and may be implemented by a System on Chip (SoC).

In one embodiment, the display 260 may include, for example, a liquid crystal display (LCD), a light emitting diode (LED) display, an organic light emitting diode (OLED) display, or the like. For example, the display 260 may display various contents (e.g., text, images, videos, icons, and/or symbols, etc.) to the user. The display 260 may include a touch screen, and may receive, for example, a touch, gesture, proximity, or hovering input performed by using an electronic pen or a user's body part.

In one embodiment, the processor 250 may generate pin insertion state information indicating a pin insertion state of each of a plurality of first pins by using the pattern light reflected from each of the plurality of first pins inserted into the first substrate and received by the image sensor 230. For example, the processor 250 may generate pin insertion state information about each of the plurality of first pins by using the image for each of the plurality of first pins generated by the image sensor 230 by using the pattern light reflected from each of the plurality of first pins. As another example, the image sensor 230 may transmit information about the received pattern light to the processor 250. The processor 250 may generate an image for each of the plurality of first pins, and may generate pin insertion state information for each of the plurality of first pins by using the image for each of the plurality of first pins. The processor 250 may display the generated pin insertion state information on the display 260. This enables the user to identify the insertion state of each of the plurality of first pins inserted into the first substrate.

In addition, the processor 250 may generate pin insertion state information for each of the plurality of first pins by using the image for each of the plurality of first pins generated by the image sensor 230 by using the first-wavelength light, the second-wavelength light and the third-wavelength light reflected from each of the plurality of first pins.

For example, the pin insertion state information may include information indicating a pin tip height, information indicating a pin shoulder height, information indicating a pin tip position, and information indicating a pin insertion position. However, this is merely for description purposes, and the present disclosure is not limited thereto. The pin insertion state information may include various kinds of information available for determining a pin insertion state.

In one embodiment, the processor 250 may detect at least one second pin having an insertion defect among the plurality of first pins by using at least one of the pin insertion reference information stored in the memory 240 and the pin insertion state information about each of the plurality of first pins. For example, the processor 250 may detect at least one second pin having an insertion defect by using only the pin insertion state information about each of the plurality of first pins. In addition, the processor 250 may detect at least one second pin having an insertion defect by comparing the pin insertion reference information with the pin insertion state information about each of the plurality of first pins. Moreover, the processor 250 may display information about the detected at least one second pin through the display 260. This enables the user to identify at least one second pin having an insertion defect. The pin insertion state information about the detected at least one second pin may be used to control the pin insertion apparatus 110. A specific method of detecting at least one second pin having an insertion defect will be described later.

In one embodiment, the processor 250 may generate a control signal for adjusting at least one first process parameter among the plurality of process parameters related to the pin insertion process of the pin insertion apparatus 110, based on the pin insertion state information for at least one second pin having an insertion defect. The processor 250 may determine at least one first process parameter to be adjusted among the plurality of process parameters, based on the pin insertion state information for the at least one second pin, and may generate a control signal for adjusting the determined at least one first process parameter.

The processor 250 may control the communication circuit 210 to transmit the generated control signal to the pin insertion apparatus 110. A specific method for determining at least one first process parameter to be adjusted and generating a control signal for adjusting the at least one first process parameter will be described later.

In one embodiment, the pin insertion apparatus 110 may adjust at least one first process parameter according to the received control signal. After adjusting the at least one first process parameter, the pin insertion apparatus 110 may perform a process of inserting a plurality of first pins into a substrate. The substrate inspection apparatus 100 may perform inspection on the substrate into which the plurality of first pins is inserted, in the same manner as described above. When an insertion defect occurs in at least one of the plurality of first pins inserted into the substrate, the substrate inspection apparatus 100 may generate a control signal for adjusting at least one of the plurality of process parameters of the pin insertion apparatus 110 in the same manner as described above, and may transmit the control signal to the pin insertion apparatus 110 once again. While repeating the above process, the substrate inspection apparatus 100 may control the pin insertion apparatus 110 so that the pin insertion apparatus 110 may operate at optimum process parameters.

Figure 3A:
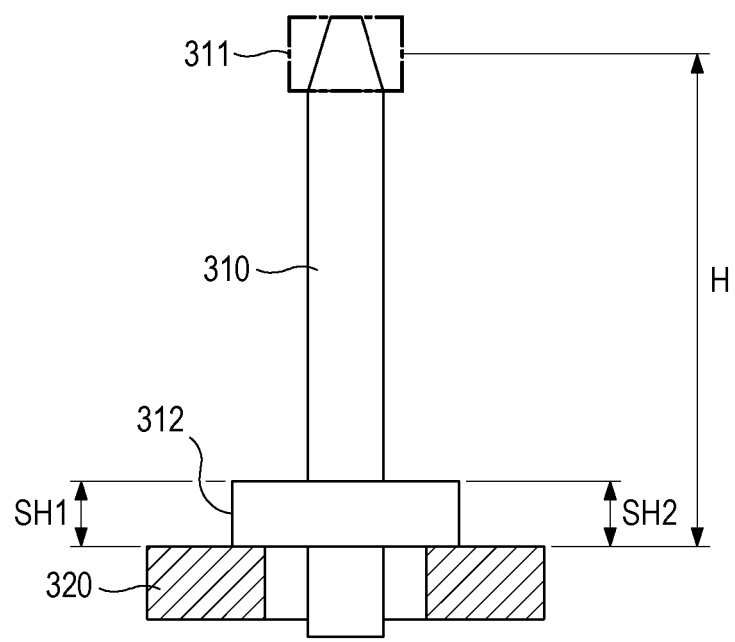
FIG. 3A is a side view of a pin inserted into a substrate according to various embodiments of the present disclosure.

FIG. 3A is a side view of a pin inserted into a substrate according to various embodiments of the present disclosure. Referring to FIG. 3A, a pin tip 311 of a pin 310 may be an upper end portion of the pin 310. As shown in FIG. 3A, the pin tip height H may be set to a height from a substrate 320 into which the pin 310 is inserted to the middle portion of the pin tip 311. However, this is merely for description purposes, and the present disclosure is not limited thereto. The pin tip height H may be set to a height from the substrate 320 to an upper end portion or a lower end portion of the pin tip 311.

A pin shoulder 312 of the pin 310 is a lower end portion of the pin 310 and may be a portion that makes contact with the substrate 320. The pin shoulder heights SH1 and SH2 may be set to a height from the substrate 320 to the upper end portion of the pin shoulder 312. However, this is merely for description purposes, and the present disclosure is not limited thereto. The pin shoulder heights SH1 and SH2 may be set to a height from the substrate 320 to a specific portion of the pin shoulder 312. In order to calculate the shoulder coplanarity, the pin shoulder height SH may include one side height SH1 of the pin shoulder 312 and the other side height SH2 of the pin shoulder 312. The processor 250 may measure a pin tip height and a pin shoulder height by applying an optical triangulation method or a bucket algorithm to an image for each of a plurality of first pins.

Figure 3B:
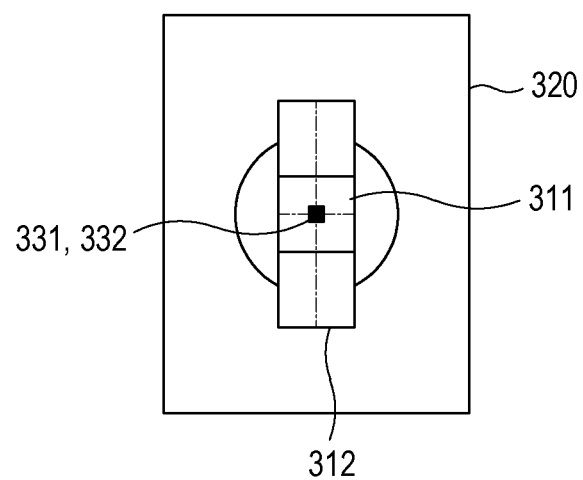
FIGS. 3B and 3C are top views of the pin inserted into the substrate according to various embodiments of the present disclosure.
Figure 3C:
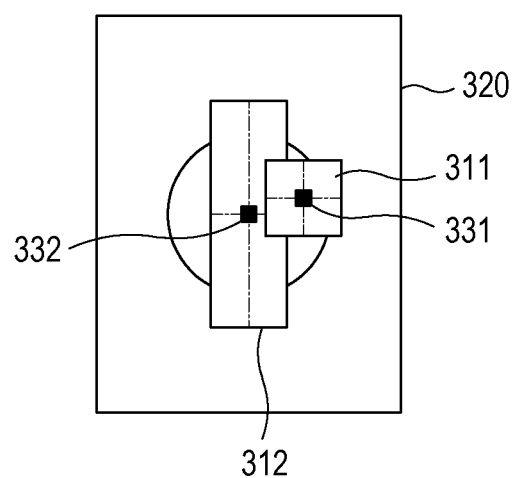

FIGS. 3B and 3C are top views of the pin inserted into the substrate according to various embodiments of the present disclosure. Referring to 3B and 3C, a pin tip position may be set to a position of a center point 331 of the upper surface of the pin tip 311. In addition, a pin insertion position may be a position of a center point 332 of the upper surface of the pin shoulder 312. The processor 250 may measure the pin tip position and the pin insertion position by using an image for each of the plurality of first pins.

For example, if the pin inserted into the substrate is not bent, as shown in FIG. 3B, the pin tip position and the pin insertion position may be the same. On the other hand, if the pin inserted into the substrate is bent, as shown in FIG. 3C, the pin tip position and the pin insertion position may be different. The processor 250 may calculate a difference $\Delta x$ or $\Delta y$ between the pin tip position and the pin insertion position based on the pin tip position and the pin insertion position.

In the above description, the pin tip position and the pin insertion position have been described as being the center point 331 of the upper surface of the pin tip 311 or the center point 332 of the upper surface of the pin shoulder 312. However, the present disclosure is not limited thereto. The pin tip position and the pin insertion position may be set to any point on each of the upper surface of the pin tip 311 and the upper surface of the pin shoulder 312 so as to specify the position of the pin tip 311 and the insertion position of the pin 310.

FIG. 4 is a flowchart of a method for inspecting an insertion state of a plurality of pins by the substrate inspection apparatus according to various embodiments of the present disclosure. In step 410, the light source 220 of the substrate inspection apparatus 100 may emit pattern light onto the first substrate into which the plurality of first pins is inserted and which is transferred from the pin insertion apparatus 110. For example, the processor 250 of the substrate inspection apparatus 100 may control the light source 220 so that when the first substrate transferred from the pin insertion apparatus 110 is located at a designated position for inspection.

In step 420, the processor 250 may generate pin insertion state information indicating an insertion state of each of the plurality of first pins by using the pattern light reflected from each of the plurality of first pins and received by the image sensor 230 of the substrate inspection apparatus 100. For example, the processor 250 may generate pin insertion state information about each of the plurality of first pins by using an image for each of the plurality of first pins generated by the image sensor 230 by using the pattern light reflected from each of the plurality of first pins. Furthermore, the processor 250 may receive information about the pattern light received from the image sensor 230, and may directly generate an image for each of the plurality of first pins by using the received pattern light information. For example, the pin insertion state information may include information indicating a pin tip height, information indicating a pin shoulder height, information indicating a pin tip position, and information indicating a pin insertion position.

In step 430, the processor 250 may detect at least one second pin having an insertion defect among the plurality of first pins by using at least one of the pin insertion reference information stored in the memory 240 and the pin insertion state information of each of the plurality of first pins. For example, the processor 250 may detect at least one second pin having an insertion defect by using the information indicating the pin tip position included in the pin insertion state information of each of the plurality of first pins and the information indicating the pin insertion position. In addition, the processor 250 may detect at least one second pin having an insertion defect by using information indicating the pin shoulder height included in the pin insertion state information of each of the plurality of first pins. In addition, the processor 250 may also detect at least one second pin having an insertion defect by comparing the reference position or reference height of each of the plurality of first pins identified using the pin insertion reference information and the pin insertion position or pin tip height of each of the plurality of first pins included in the pin insertion state information of each of the plurality of first pins.

In step 440, the processor 250 may generate a control signal for adjusting at least one first process parameter among the plurality of process parameters of the pin insertion apparatus 110, based on the pin insertion state information of the at least one second pin detected to have an insertion defect. For example, the processor 250 may determine at least one first process parameter available for improvement of an insertion defect of at least one second pin, among the plurality of process parameters, based on the pin insertion state information of the at least one second pin.

For example, the processor 250 may determine at least one first process parameter available for improvement of an insertion defect among the plurality of process parameters, and an adjustment value of the at least one first process parameter, by further using the information about a plurality of process parameters and the information about values of the plurality of process parameters stored in the memory 240. Hereinafter, for the sake of convenience of description, the description will be made by focusing on a case where an adjustment value of at least one first process parameter to be adjusted is determined as a specific value. However, the present disclosure is not limited thereto. The processor 250 may determine a range of an adjustment value of at least one first process parameter. The processor 250 may generate a control signal for adjusting the at least one first process parameter, based on the determined adjustment value of the at least one first process parameter.

In addition, when the at least one first process parameter is adjusted just as much as the adjustment value of the at least one first process parameter, the processor 250 may display the predicted pin insertion state information of at least one second pin on the display 260. This enables the user to confirm whether the at least one first process parameter has been properly adjusted.

In step 450, the processor 250 may control the communication circuit 210 to transmit the control signal generated in step 440 to the pin insertion apparatus 110. The pin insertion apparatus 110 may adjust at least one first process parameter according to the received control signal. After adjusting the at least one first process parameter, the pin insertion apparatus 110 may perform a process of inserting a plurality of first pins into a substrate again.

FIG. 5 is a flowchart of a method for detecting at least one second pin having an insertion defect by using a pin insertion position of each of a plurality of first pins inserted into a substrate according to various embodiments of the present disclosure. In step 510, the processor 250 of the substrate inspection apparatus 100 may identify a reference position of each of a plurality of first pins based on the pin insertion reference information stored in the memory 240. The reference position of each of the plurality of first pins may be a position where each of the plurality of first pins is inserted into a first substrate. The reference position of each of the plurality of first pins may be set based on the design information of the first substrate, or may be set according to a user input regardless of the design information of the first substrate.

In step 520, the processor 250 may identify a pin insertion position of each of the plurality of first pins based on the pin insertion state information of each of the plurality of first pins generated in step 420. As described above, the pin insertion position of each of the plurality of first pins may be the position of the center point of the upper surface of the pin shoulder.

In step 530, the processor 250 may calculate a difference between the reference position of each of the plurality of first pins and the pin insertion position of each of the plurality of first pins. The processor 250 may determine occurrence or non-occurrence of an insertion defect depending on whether each of the plurality of first pins is correctly inserted at a preset reference position. Accordingly, the processor 250 may calculate a difference between the reference position of each of the plurality of first pins and the pin insertion position of each of the plurality of first pins in order to determine an insertion defect.

In step 540, when at least one pin in which the difference calculated in step 530 is equal to or greater than a preset first threshold value is detected from among the plurality of first pins, the processor 250 may determine the detected at least one pin as at least one second pin having the insertion defect. For example, the first threshold value is a reference value for determining whether each of the plurality of first pins is inserted at a preset reference position, and may be set according to the design information of the first substrate or the user input. The processor 250 may determine that the at least one pin in which the calculated difference is equal to or greater than the preset first threshold value has an insertion defect, and may determine the at least one pin as at least one second pin having the insertion defect.

Furthermore, the processor 250 may display information about the at least one second pin on the display 260 of the substrate inspection apparatus 100. For example, the information about the at least one second pin may include shape information of the at least one second pin, pin insertion position information of the at least one second pin, and the like. However, this is merely for description purposes, and the present disclosure is not limited thereto. The information about the at least one second pin displayed on the display 260 may include various kinds of information about the at least one second pin for enabling the user to easily recognize the at least one second pin among the plurality of first pins.

Figure 6:
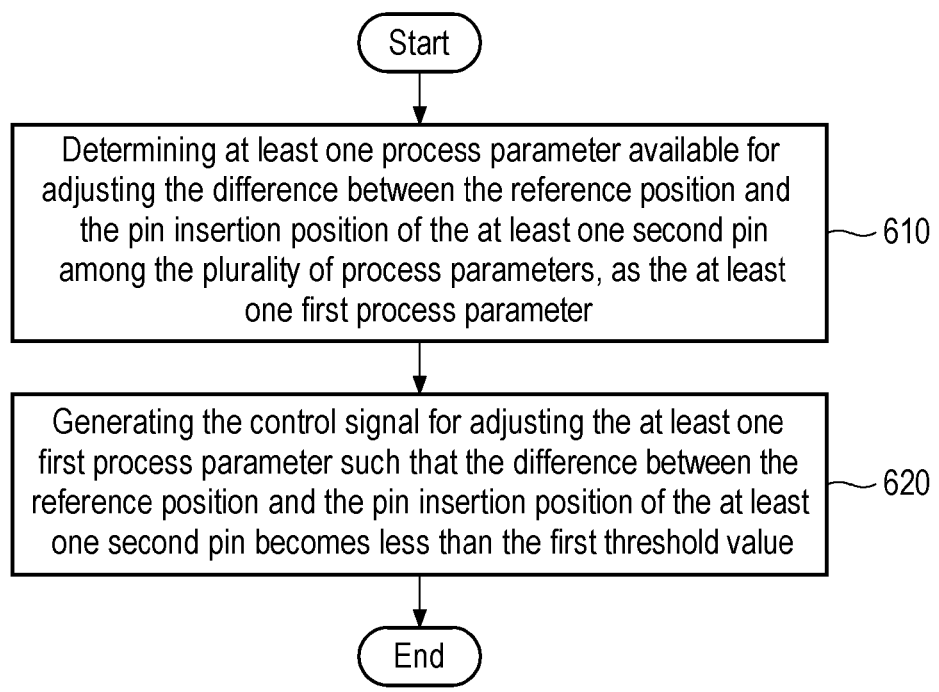
FIG. 6 is a flowchart of a method for generating a control signal for adjusting a process parameter, based on the pin insertion state information of at least one second pin having an insertion defect detected by using a pin insertion position according to various embodiments of the present disclosure.

FIG. 6 is a flowchart of a method for generating a control signal for adjusting a process parameter, based on the pin insertion state information of at least one second pin having an insertion defect detected by using a pin insertion position according to various embodiments of the present disclosure. In step 610, the processor 250 of the substrate inspection apparatus 100 may determine at least one process parameter available for adjusting the difference between the reference position of the at least one second pin having an insertion defect and the pin insertion position of the at least one second pin detected in step 540 among the plurality of process parameters of the pin insertion apparatus 110, as at least one first process parameter to be adjusted.

In one embodiment, the at least one process parameter available for adjusting the difference between the reference position of the at least one second pin and the pin insertion position of the at least one second pin among the plurality of process parameters may be a process parameter that may affect the pin insertion position on the substrate in the pin insertion process of the pin insertion apparatus 110. The processor 250 may determine at least one process parameter that may affect the pin insertion position, among the plurality of process parameters, by further using the information about the plurality of process parameters of the pin insertion apparatus 110 stored in the memory 240.

For example, the at least one process parameter that may affect the pin insertion position may include at least one process parameter that may adjust the pin insertion position, a process parameter for adjusting a movement speed of a pin insertion head used for pin insertion, and the like. However, this is merely for description purposes, and the present disclosure is not limited thereto. The at least one process parameter that may affect the pin insertion position may include various process parameters of the pin insertion apparatus 110 that may affect the pin insertion position in the pin insertion process.

In step 620, the processor 250 may generate a control signal for adjusting the at least one first process parameter determined in step 610 such that the difference between the reference position of the at least one second pin and the pin insertion position of the at least one second pin becomes less than the first threshold value. The processor 250 may determine an adjustment value of the at least one first process parameter for assuring that the difference between the reference position of the at least one second pin and the pin insertion position of the at least one second pin is less than the first threshold value, by further using the information about values of the plurality of process parameters stored in the memory 240.

For example, the processor 250 may identify the value of the at least one first process parameter used in the pin insertion process for the first substrate performed by the pin insertion apparatus 110, by using information about the values of the plurality of process parameters. When the at least one first process parameter is adjusted just as much as a specific value based on the value of the at least one first process parameter and the pin insertion position of the at least one second pin, the processor 250 may predict how much the pin insertion position of the at least one second pin will change. The processor 250 may determine an adjustment value of the at least one first process parameter according to the prediction result. The processor 250 may generate a control signal for adjusting the at least one first process parameter, based on the determined adjustment value of the at least one first process parameter.

Figure 7:
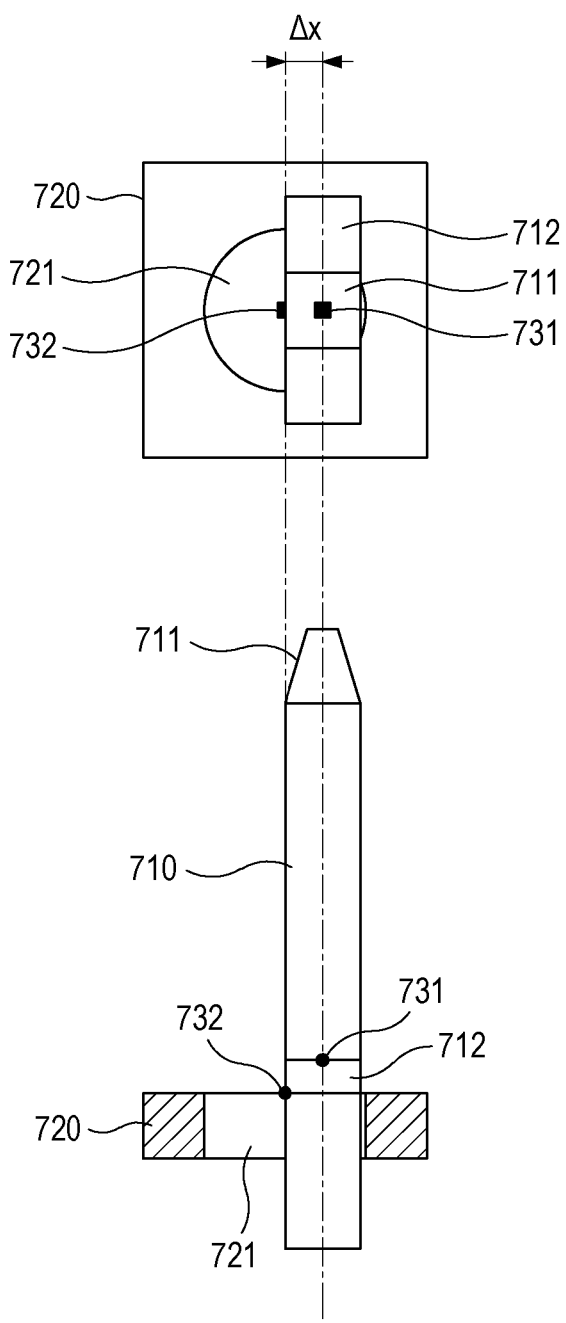
FIG. 7 illustrates the pin having an insertion defect detected by using the pin insertion position according to various embodiments of the present disclosure.

FIG. 7 illustrates the pin having an insertion defect detected by using the pin insertion position according to various embodiments of the present disclosure. According to various embodiments of the present disclosure, the processor 250 of the substrate inspection apparatus 100 may measure the pin tip position and the pin insertion position 731 by using the position of the center point of the upper surface of the pin tip 711 of the pin 710 and the position of the center point of the upper surface of the pin shoulder 712. As shown in FIG. 7, when the pin tip position of the pin 710 and the pin insertion position 731 are the same, the processor 250 may determine that the pin 710 is not bent.

In addition, the processor 250 may calculate a difference Δx between the pin insertion position 731 of the pin 710 and the reference position 732 of the pin 710 identified based on the pin insertion reference information stored in the memory 240. As shown in FIG. 7, the reference position 732 of the pin 710 may be set to a position of a center point of a hole 721 of a substrate 720 into which the pin 710 is to be inserted.

The processor 250 may determine whether the difference Δx is equal to or greater than a preset first threshold value. When it is determined that the difference Δx is equal to or greater than the first threshold value, the processor 250 may determine that the pin 710 has an insertion defect. The processor 250 may generate a control signal for adjusting at least one first process parameter among the plurality of process parameters of the pin insertion apparatus 110 as described with reference to FIG. 6 such that the difference Δx becomes less than the first threshold value, and may transmit the control signal to the pin insertion apparatus 110.

The pin insertion apparatus 110 may perform a process of adjusting at least one first process parameter according to the received control signal and inserting a plurality of first pins into a substrate. This makes it possible to improve the pin insertion defect in the subsequent pin insertion process.

Figure 8:
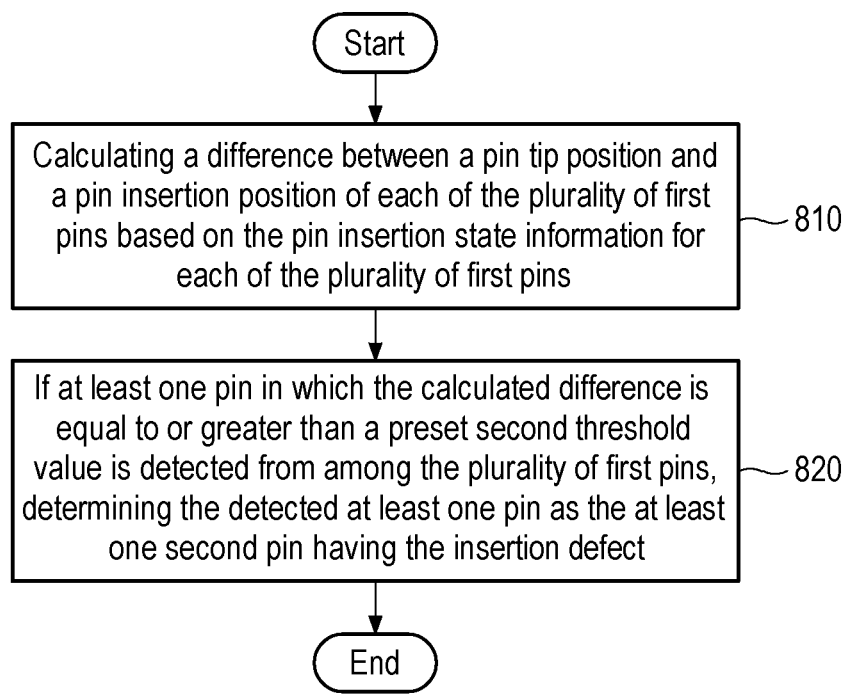
FIG. 8 is a flowchart of a method for detecting at least one second pin having an insertion defect by using a difference between a pin tip position and a pin insertion position according to various embodiments of the present disclosure.

FIG. 8 is a flowchart of a method for detecting at least one second pin having an insertion defect by using a difference between a pin tip position and a pin insertion position according to various embodiments of the present disclosure. In step 810, the processor 250 of the substrate inspection apparatus 100 may calculate a difference between the pin tip position and the pin insertion position of each of the plurality of first pins identified based on the pin insertion state information for each of the plurality of first pins generated in step 420. The processor 250 may calculate the difference between the pin tip position and the pin insertion position to determine whether each of the plurality of first pins is bent in the process of being inserted into the first substrate.

In step 820, when at least one pin in which the difference calculated in step 810 is equal to or greater than a preset second threshold value is detected from among the plurality of first pins, the processor 250 may determine the detected at least one pin as at least one second pin having the insertion defect. For example, the second threshold value is a reference value for determining whether each of the plurality of first pins is bent in the process of being inserted into the first substrate, and may be set according to the design information of the first substrate or the user input. The processor 250 may determine that the at least one pin in which the calculated difference is equal to or greater than the preset second threshold value has an insertion defect by being bent in the pin insertion process, and may determine the at least one pin as at least one second pin having the insertion defect. Furthermore, the processor 250 may display information about the at least one second pin on the display 260 of the substrate inspection apparatus 100.

Figure 9:
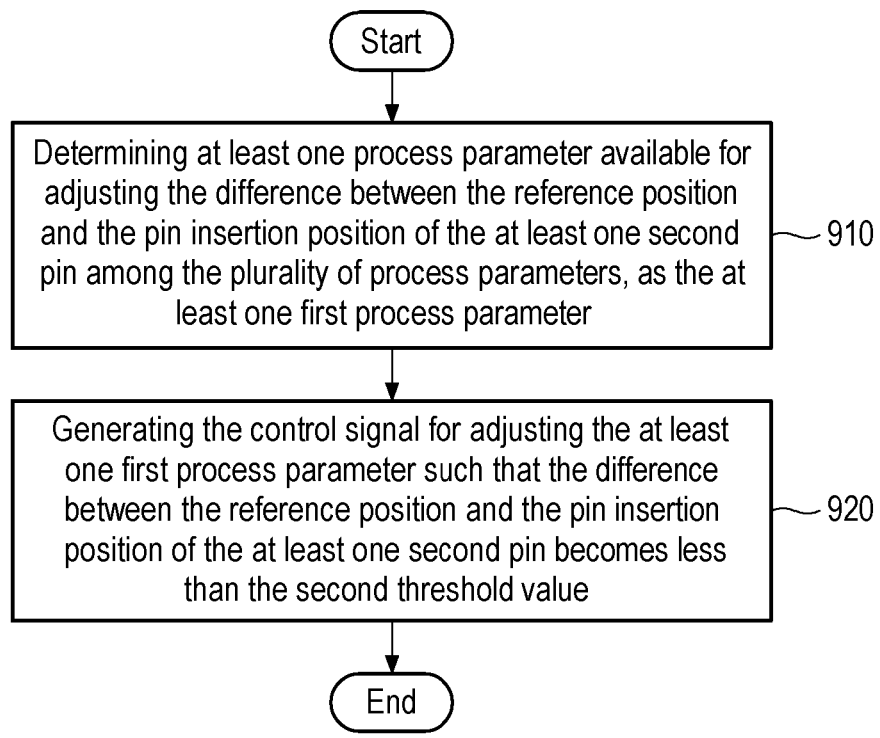
FIG. 9 is a flowchart of a method for generating a control signal for adjusting a process parameter, based on the pin insertion state information of at least one second pin having an insertion defect detected by using the difference between the pin tip position and the pin insertion position according to various embodiments of the present disclosure.

FIG. 9 is a flowchart of a method for generating a control signal for adjusting a process parameter, based on the pin insertion state information of at least one second pin having an insertion defect detected by using the difference between the pin tip position and the pin insertion position according to various embodiments of the present disclosure. In step 910, the processor 250 of the substrate inspection apparatus 100 may determine at least one process parameter available for adjusting the difference between the pin tip position and the pin insertion position of the at least one second pin having an insertion defect detected in step 820 among the plurality of process parameters of the pin insertion apparatus 110, as at least one first process parameter to be adjusted.

In one embodiment, the at least one process parameter available for adjusting the difference between the pin tip position and the pin insertion position of the at least one second pin among the plurality of process parameters may be a process parameter that may affect the pin bending in the pin insertion process of the pin insertion apparatus 110. The processor 250 may determine at least one process parameter that may affect the pin bending, among the plurality of process parameters, by further using the information about the plurality of process parameters stored in the memory 240.

For example, the at least one process parameter that may affect the pin bending may include a process parameter for adjusting a pin insertion force, a process parameter for adjusting a pin insertion speed, a process parameter for adjusting a position of an anvil, and the like. However, this is merely for description purposes, and the present disclosure is not limited thereto. The at least one process parameter that may affect the pin bending may include various process parameters of the pin insertion apparatus 110 that may affect the pin bending in the pin insertion process.

In step 920, the processor 250 may generate a control signal for adjusting the at least one first process parameter determined in step 910 such that the difference between the pin tip position and the pin insertion position of the at least one second pin becomes less than the second threshold value. The processor 250 may determine an adjustment value of the at least one first process parameter for assuring that the difference between the pin tip position and the pin insertion position of the at least one second pin is less than the second threshold value, by further using the information about values of the plurality of process parameters stored in the memory 240.

For example, the processor 250 may identify the value of the at least one first process parameter used in the pin insertion process for the first substrate performed by the pin insertion apparatus 110, by using information about the values of the plurality of process parameters. When the at least one first process parameter is adjusted just as much as a specific value based on the value of the at least one first process parameter, and the pin tip position and the pin insertion position of the at least one second pin, the processor 250 may predict how much the pin tip position and the pin insertion position of the at least one second pin will change. The processor 250 may determine an adjustment value of the at least one first process parameter according to the prediction result. The processor 250 may generate a control signal for adjusting the at least one first process parameter, based on the determined adjustment value of the at least one first process parameter.

Figure 10:
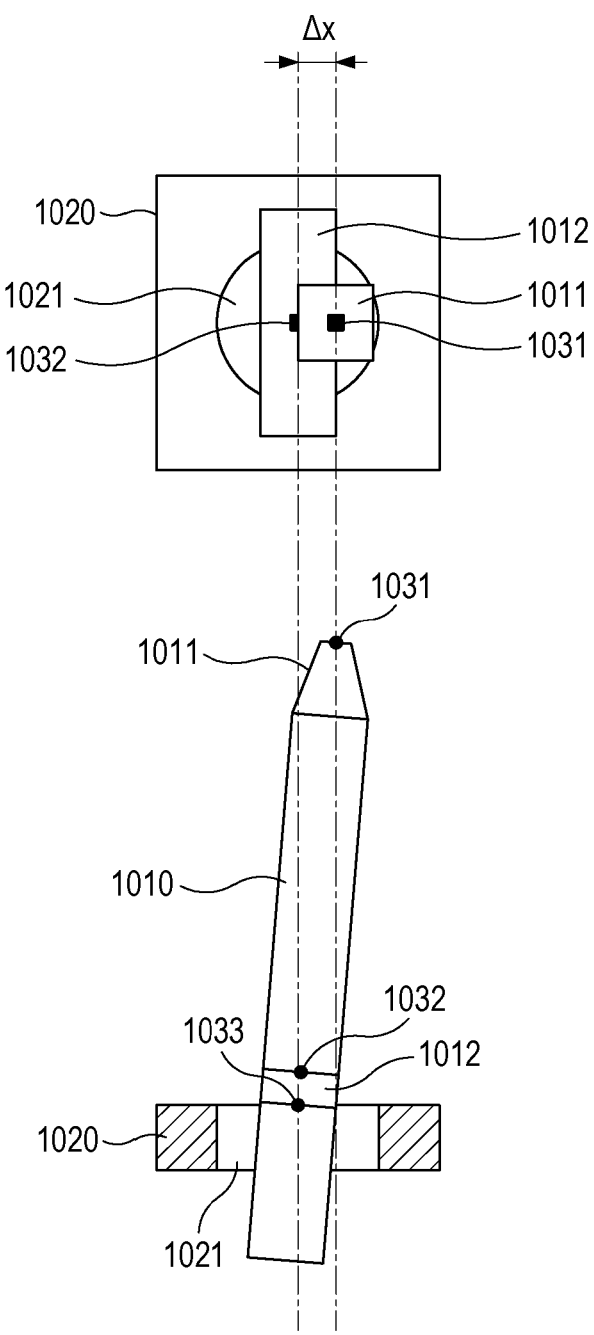
FIG. 10 illustrates the pin having an insertion defect detected by using the difference between the pin tip position and the pin insertion position according to various embodiments of the present disclosure.

FIG. 10 illustrates the pin having an insertion defect detected by using the difference between the pin tip position and the pin insertion position according to various embodiments of the present disclosure. According to various embodiments of the present disclosure, the processor 250 of the substrate inspection apparatus 100 may measure a pin tip position 1031 and a pin insertion position 1032 by using the position of the center point of the upper surface of the pin tip 1011 of the pin 1010 and the position of the center point of the upper surface of the pin shoulder 1012.

When the difference between the pin insertion position 1032 of the pin 1010 and the reference position 1033 of the pin 1010 identified based on the pin insertion reference information stored in the memory 240 is less than a preset first threshold value, the processor 250 may determine that there is no problem in the pin insertion position 1032 of the pin 1010. As shown in FIG. 10, the reference position 1033 of the pin 1010 may be set to a position of a center point of a hole 1021 of a substrate 1020 into which the pin 1010 is to be inserted.

The processor 250 may determine whether a difference Δx between the pin tip position 1031 and the pin insertion position 1032 is equal to or greater than a preset second threshold value. When it is determined that the difference Δx is equal to or greater than the second threshold value, the processor 250 may determine that the pin 1010 is bent and further that the pin 1010 has an insertion defect. The processor 250 may generate a control signal for adjusting at least one first process parameter among the plurality of process parameters of the pin insertion apparatus 110 as described with reference to FIG. 9 such that the difference Δx becomes less than the second threshold value, and may transmit the control signal to the pin insertion apparatus 110.

The pin insertion apparatus 110 may perform a process of adjusting at least one first process parameter according to the received control signal and inserting a plurality of first pins into a substrate. This makes it possible to improve the pin insertion defect in the subsequent pin insertion process.

Figure 11:
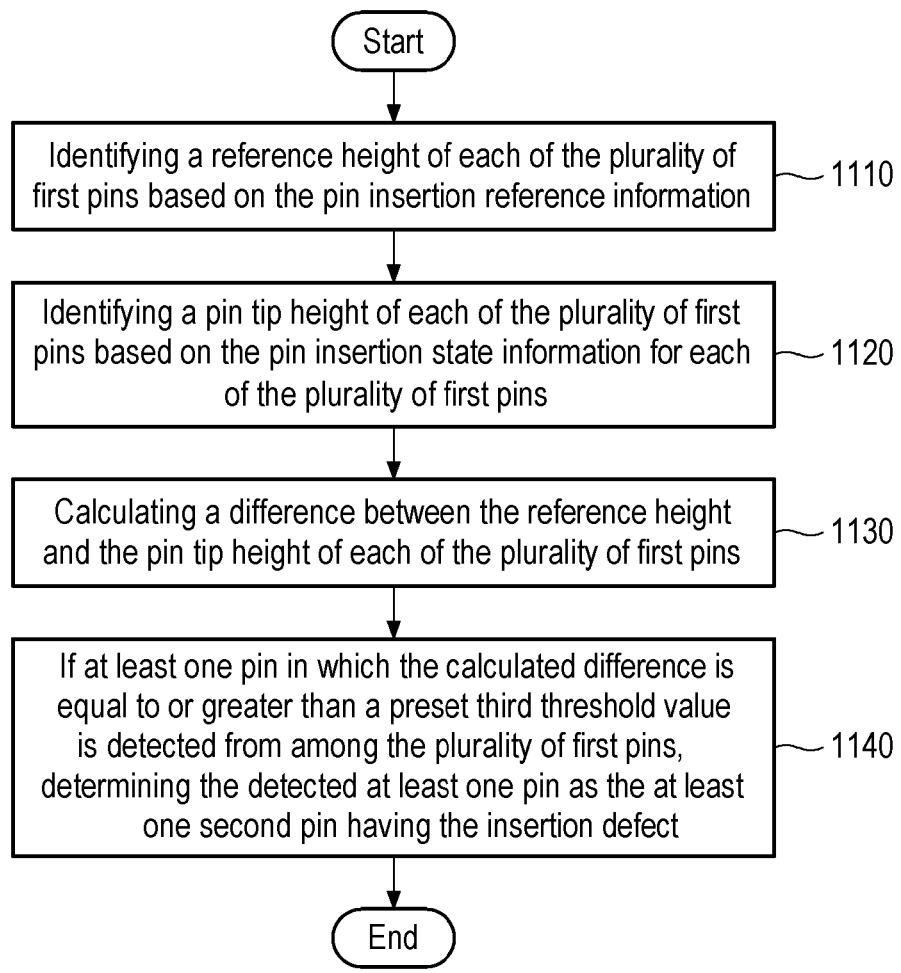
FIG. 11 is a flowchart of a method for detecting at least one second pin having an insertion defect by using a pin tip height according to various embodiments of the present disclosure.

FIG. 11 is a flowchart of a method for detecting at least one second pin having an insertion defect by using a pin tip height according to various embodiments of the present disclosure. In step 1110, the processor 250 of the substrate inspection apparatus 100 may identify a reference height of each of a plurality of first pins based on the pin insertion reference information stored in the memory 240. The reference height of each of the plurality of first pins may be set to a height which serves as a reference for determining whether each of the plurality of first pins is inserted so that the pin shoulder makes contact with the first substrate. The reference height of each of the plurality of first pins may be set based on the design information of the first substrate, or may be set according to a user input regardless of the design information of the first substrate.

In step 1120, the processor 250 may identify a pin tip height of each of the plurality of first pins based on the pin insertion state information of each of the plurality of first pins generated in step 420. As described above, the pin tip height of each of the plurality of first pins may be set to a height from the first substrate to the middle portion of the pin tip. In addition, since the pin tip is the upper end portion of the pin, the pin tip height may indicate the height of the pin.

In step 1130, the processor 250 may calculate a difference between the reference height of each of the plurality of first pins and the pin tip height of each of the plurality of first pins. The processor 250 may determine occurrence or non-occurrence of an insertion defect depending on whether each of the plurality of first pins is inserted so that the pin shoulder makes contact with the first substrate. Accordingly, the processor 250 may calculate the difference between the reference height of each of the plurality of first pins and the pin tip height of each of the plurality of first pins in order to determine an insertion defect.

In step 1140, when at least one pin in which the difference calculated in step 1130 is equal to or greater than a preset third threshold value is detected from among the plurality of first pins, the processor 250 may determine the detected at least one pin as at least one second pin having the insertion defect. For example, the third threshold value is a reference value for determining whether each of the plurality of first pins is inserted so that the pin shoulder makes contact with the first substrate, and may be set according to the design information of the first substrate or the user input. The processor 250 may determine that the at least one pin in which the calculated difference is equal to or greater than the third threshold value has an insertion defect, and may determine the at least one pin as at least one second pin having an insertion defect. Furthermore, the processor 250 may display information about the at least one second pin on the display 260 of the substrate inspection apparatus 100.

Figure 12:
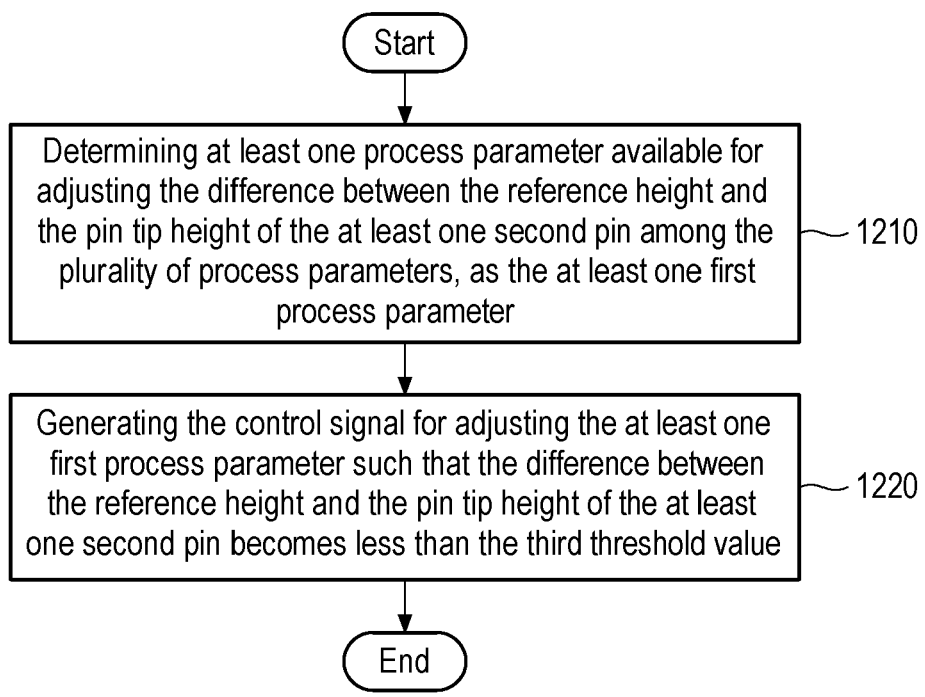
FIG. 12 is a flowchart of a method for generating a control signal for adjusting a process parameter, based on the pin insertion state information of at least one second pin having an insertion defect detected by using the pin tip height according to various embodiments of the present disclosure.

FIG. 12 is a flowchart of a method for generating a control signal for adjusting a process parameter, based on the pin insertion state information of at least one second pin having an insertion defect detected by using a pin tip height according to various embodiments of the present disclosure. In step 1210, the processor 250 of the substrate inspection apparatus 100 may determine at least one process parameter available for adjusting the difference between the reference height of the at least one second pin having an insertion defect and the pin tip height of the at least one second pin detected in step 1140 among the plurality of process parameters of the pin insertion apparatus 110, as at least one first process parameter to be adjusted.

In one embodiment, the at least one process parameter available for adjusting the difference between the reference height of the at least one second pin and the pin tip height of the at least one second pin among the plurality of process parameters may be a process parameter that may affect the height of the tip of the pin inserted into the substrate in the pin insertion process of the pin insertion apparatus 110. The processor 250 may determine at least one process parameter that may affect the pin tip height, among the plurality of process parameters, by further using the information about the plurality of process parameters of the pin insertion apparatus 110 stored in the memory 240.

For example, the at least one process parameter that may affect the pin tip height may include a process parameter for adjusting a pin insertion force, a process parameter for adjusting a pin insertion speed, a process parameter for adjusting a position of an anvil, and the like. However, this is merely for description purposes, and the present disclosure is not limited thereto. The at least one process parameter that may affect the pin tip height may include various process parameters of the pin insertion apparatus 110 that may affect the pin tip height in the pin insertion process.

In step 1220, the processor 250 may generate a control signal for adjusting the at least one first process parameter determined in step 1210 such that the difference between the reference height of the at least one second pin and the pin tip height of the at least one second pin becomes less than the third threshold value. The processor 250 may determine an adjustment value of the at least one first process parameter for assuring that the difference between the reference height of the at least one second pin and the pin tip height of the at least one second pin is less than the third threshold value, by further using the information about values of the plurality of process parameters stored in the memory 240.

For example, the processor 250 may identify the value of the at least one first process parameter used in the pin insertion process for the first substrate performed by the pin insertion apparatus 110, by using information about the values of the plurality of process parameters. When the at least one first process parameter is adjusted just as much as a specific value based on the value of the at least one first process parameter and the pin tip height of the at least one second pin, the processor 250 may predict how much the pin tip height of the at least one second pin will change. The processor 250 may determine an adjustment value of the at least one first process parameter according to the prediction result. The processor 250 may generate a control signal for adjusting the at least one first process parameter, based on the determined adjustment value of the at least one first process parameter.

Figure 13:
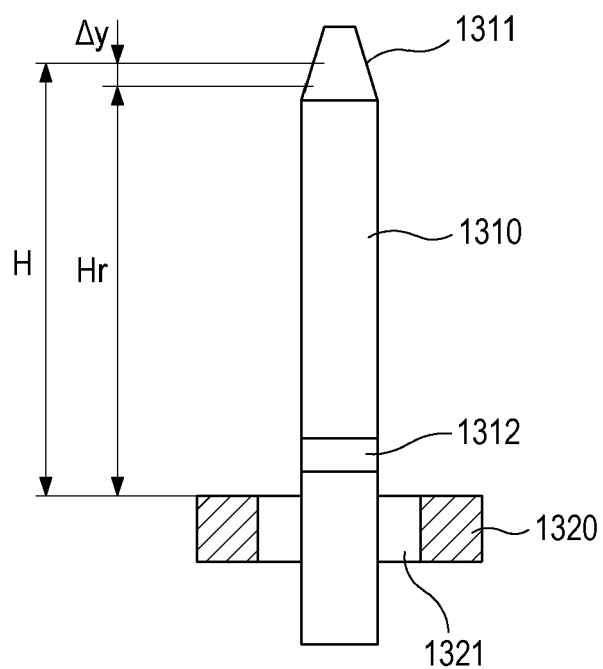
FIG. 13 illustrates the pin having an insertion defect detected by using the pin tip height according to various embodiments of the present disclosure.

FIG. 13 illustrates the pin having an insertion defect detected by using the pin tip height according to various embodiments of the present disclosure. According to various embodiments of the present disclosure, the processor 250 of the substrate inspection apparatus 100 may measure the height from the substrate 1320 to the middle portion of the pin tip 1311 of the pin 1310 as a pin tip height H of the pin 1310. In addition, the processor 250 may calculate a difference Δy between the pin tip height H of the pin 1310 and the reference height Hr of the pin 1310 identified based on the pin insertion reference information stored in the memory 240.

The processor 250 may determine whether the difference Δy is equal to or greater than a preset third threshold value. When it is determined that the difference Δy is equal to or greater than the first threshold value, the processor 250 may determine that the pin 1310 has an insertion defect. The processor 250 may generate a control signal for adjusting at least one first process parameter among the plurality of process parameters of the pin insertion apparatus 110 as described with reference to FIG. 12 such that the difference Δy becomes less than the third threshold value, and may transmit the control signal to the pin insertion apparatus 110.

The pin insertion apparatus 110 may perform a process of adjusting at least one first process parameter according to the received control signal and inserting a plurality of first pins into a substrate. This makes it possible to improve the pin insertion defect in the subsequent pin insertion process.

Figure 14:
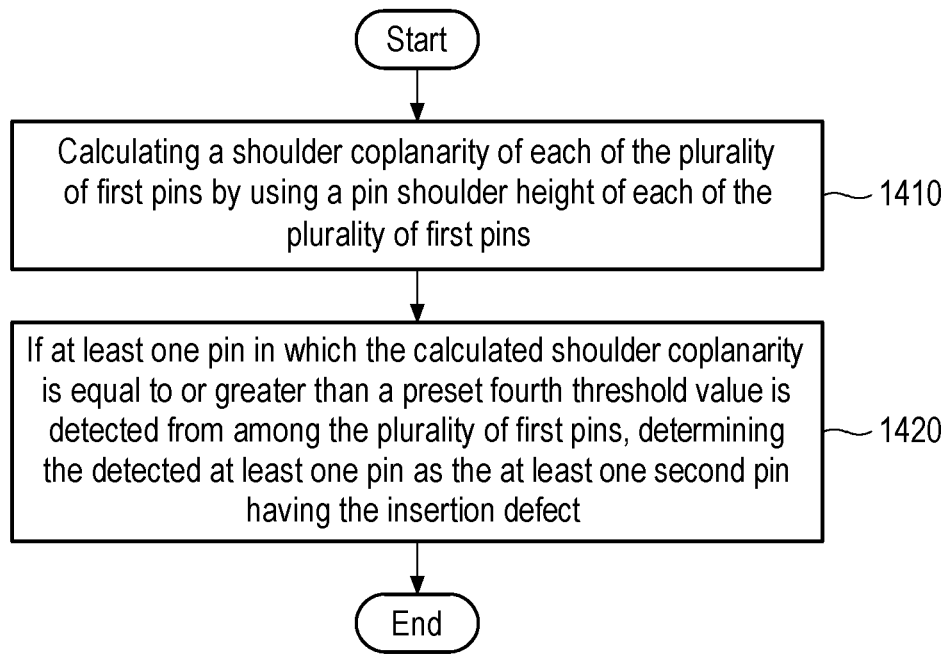
FIG. 14 is a flowchart of a method for detecting at least one second pin having an insertion defect by using shoulder coplanarity according to various embodiments of the present disclosure.

FIG. 14 is a flowchart of a method for detecting at least one second pin having an insertion defect by using shoulder coplanarity according to various embodiments of the present disclosure. In step 1410, the processor 250 of the substrate inspection apparatus 100 may calculate a shoulder coplanarity of each of the plurality of first pins identified based on the pin insertion state information for each of the plurality of first pins generated in step 420. For example, a pin shoulder height may include one side height of the pin shoulder and the other side height of the pin shoulder. The processor 250 may calculate the shoulder coplanarity of each of the plurality of first pins by using a difference between one side height and the other side height of the pin shoulder identified by using the shoulder height of each of the plurality of first pins.

In step 1420, when at least one pin in which the shoulder coplanarity calculated in step 1410 is equal to or greater than a preset fourth threshold value is detected from among the plurality of first pins, the processor 250 may determine the detected at least one pin as at least one second pin having the insertion defect. For example, the fourth threshold value is a reference value for determining whether each of the plurality of first pins is inserted so that the pin shoulder has a coplanarity, and may be set according to the design information of the first substrate or the user input. The processor 250 may determine that the at least one pin in which the calculated shoulder coplanarity is equal to or greater than the fourth threshold value has an insertion defect caused by the pin shoulder which is not inserted in a coplanar manner in the pin insertion process, and may determine the at least one pin as at least one second pin having the insertion defect. Furthermore, the processor 250 may display information about the at least one second pin on the display 260 of the substrate inspection apparatus 100.

Figure 15:
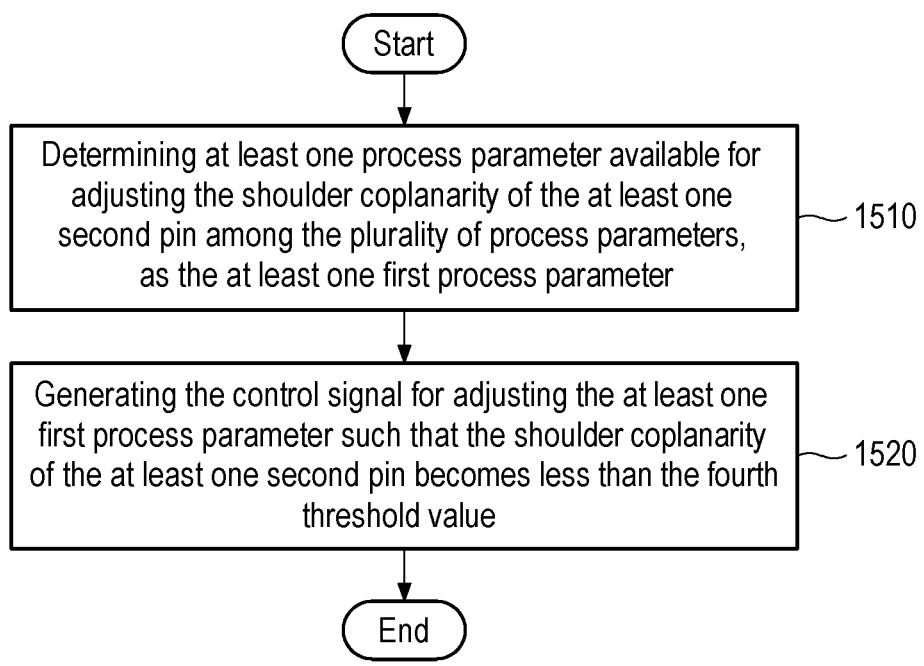
FIG. 15 is a flowchart of a method for generating a control signal for adjusting a process parameter, based on the pin insertion state information of at least one second pin having the insertion defect detected by using the shoulder coplanarity according to various embodiments of the present disclosure.

FIG. 15 is a flowchart of a method for generating a control signal for adjusting a process parameter, based on the pin insertion state information of at least one second pin having an insertion defect detected by using shoulder coplanarity according to various embodiments of the present disclosure. In step 1510, the processor 250 of the substrate inspection apparatus 100 may determine at least one process parameter available for adjusting the shoulder coplanarity of the at least one second pin having an insertion defect detected in step 1420 among the plurality of process parameters of the pin insertion apparatus 110, as at least one first process parameter to be adjusted.

In one embodiment, the at least one process parameter available for adjusting the shoulder coplanarity of the at least one second pin among the plurality of process parameters may be a process parameter that may affect the shoulder coplanarity in the pin insertion process of the pin insertion apparatus 110. The processor 250 may determine at least one process parameter that may affect the shoulder coplanarity, among the plurality of process parameters, by further using the information about the plurality of process parameters stored in the memory 240.

For example, the at least one process parameter that may affect the shoulder coplanarity may include a process parameter for adjusting a pin insertion force, a process parameter for adjusting a pin insertion speed, a process parameter for adjusting a position of an anvil, and the like. However, this is merely for description purposes, and the present disclosure is not limited thereto. The at least one process parameter that may affect the shoulder coplanarity may include various process parameters of the pin insertion apparatus 110 that may affect the shoulder coplanarity in the pin insertion process.

In step 1520, the processor 250 may generate a control signal for adjusting the at least one first process parameter determined in step 1510 such that the shoulder coplanarity of the at least one second pin becomes less than the fourth threshold value. The processor 250 may determine an adjustment value of the at least one first process parameter for assuring that the shoulder coplanarity of the at least one second pin is less than the fourth threshold value, by further using the information about values of the plurality of process parameters stored in the memory 240.

For example, the processor 250 may identify the value of the at least one first process parameter used in the pin insertion process for the first substrate performed by the pin insertion apparatus 110, by using information about the values of the plurality of process parameters. When the at least one first process parameter is adjusted just as much as a specific value based on the value of the at least one first process parameter and the shoulder coplanarity of the at least one second pin, the processor 250 may predict how much the shoulder coplanarity of the at least one second pin will change. The processor 250 may determine an adjustment value of the at least one first process parameter according to the prediction result. The processor 250 may generate a control signal for adjusting the at least one first process parameter, based on the determined adjustment value of the at least one first process parameter.

Figure 16:
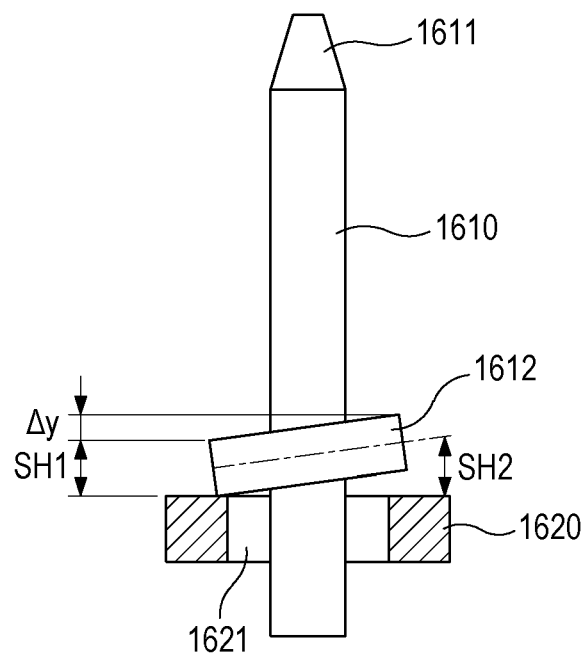
FIG. 16 illustrates the pin having an insertion defect detected by using the shoulder coplanarity according to various embodiments of the present disclosure.

FIG. 16 illustrates the pin having an insertion defect detected by using the shoulder coplanarity according to various embodiments of the present disclosure. According to various embodiments of the present disclosure, the processor 250 of the substrate inspection apparatus 100 may measure the height from the substrate 1620 to the middle portion of the pin tip 1611 of the pin 1610 as a pin tip height, and may measure the height from the substrate 1620 to the upper end portion of the pin shoulder 1612 of the pin 1610 as pin shoulder heights SH1 and SH2. The processor 250 may calculate a shoulder coplanarity using the difference Δy between one side height SH1 and the other side height SH2 of the pin shoulder.

The processor 250 may determine whether the shoulder coplanarity is equal to or greater than a preset fourth threshold value. When it is determined that the shoulder coplanarity is equal to or greater than the fourth threshold value, the processor 250 may determine that the pin shoulder of the pin 1610 is not coplanar and the pin 1610 has an insertion defect. The processor 250 may generate a control signal for adjusting at least one first process parameter among the plurality of process parameters of the pin insertion apparatus 110 as described with reference to FIG. 15 such that the shoulder coplanarity becomes less than the fourth threshold value, and may transmit the control signal to the pin insertion apparatus 110.

The pin insertion apparatus 110 may perform a process of adjusting at least one first process parameter according to the received control signal and inserting a plurality of first pins into a substrate. This makes it possible to improve the pin insertion defect in the subsequent pin insertion process.

Figure 17:
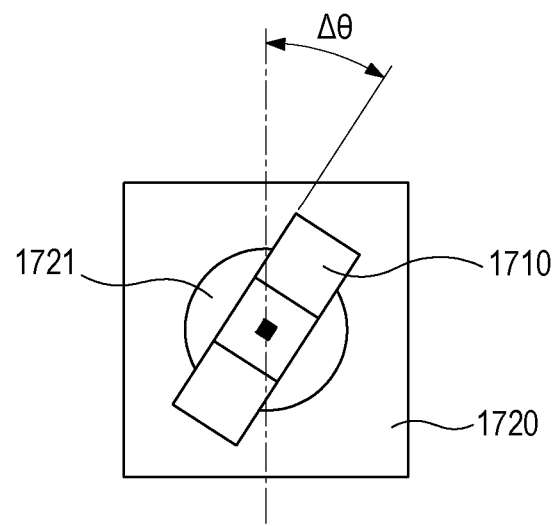
FIG. 17 illustrates a pin having an insertion defect detected by using an insertion angle according to various embodiments of the present disclosure.

FIG. 17 illustrates a pin having an insertion defect detected by using an insertion angle according to various embodiments of the present disclosure. According to various embodiments of the present disclosure, the pin insertion reference information stored in the memory 240 may further indicate a reference insertion angle set for a pin inserted into a substrate. The processor 250 of the substrate inspection apparatus 100 may identify a reference insertion angle of the pin identified based on the pin insertion reference information.

The processor 250 may measure an insertion angle of a pin 1710 inserted into a hole 1721 of a substrate 1720 by using an image of the pin. The processor 250 may determine whether a difference Δθ between the pin insertion angle of the pin 1710 identified by the processor 250 and the reference insertion angle is equal to or greater than a preset fifth threshold value. For example, the fifth threshold value may be a reference value for determining whether the pin is inserted at a preset reference insertion angle. When it is determined that the difference Δθ is equal to or greater than the fifth threshold value, the processor 250 may determine that the pin 1710 is not inserted at the preset reference insertion angle and further that the pin 1710 has an insertion defect. The processor 250 may generate a control signal for adjusting at least one first process parameter among the plurality of process parameters of the pin insertion apparatus 110 such that the difference Δθ becomes less than the fifth threshold value, and may transmit the control signal to the pin insertion apparatus 110.

The pin insertion apparatus 110 may perform a process of adjusting at least one first process parameter according to the received control signal and inserting a plurality of first pins into a substrate. This makes it possible to improve the pin insertion defect in the subsequent pin insertion process.

While the foregoing methods have been described with respect to particular embodiments, these methods may also be implemented as computer-readable codes on a computer-readable recording medium. The computer-readable recording medium includes any kind of data storage devices that can be read by a computer system. Examples of the computer-readable recording medium includes ROM, RAM, CD-ROM, magnetic tape, floppy disk, optical data storage device and the like. Also, the computer-readable recoding medium can be distributed on computer systems which are connected through a network so that the computer-readable codes can be stored and executed in a distributed manner. Further, the functional programs, codes and code segments for implementing the foregoing embodiments can easily be inferred by programmers in the art to which the present disclosure pertains.

Although the technical spirit of the present disclosure has been described by the examples described in some embodiments and illustrated in the accompanying drawings, it should be noted that various substitutions, modifications, and changes can be made without departing from the scope of the present disclosure which can be understood by those skilled in the art to which the present disclosure pertains. In addition, it should be noted that such substitutions, modifications and changes are intended to fall within the scope of the appended claims.

What is claimed is:

1. A substrate inspection apparatus for inspecting insertion states of a plurality of pins inserted into a substrate, comprising:
   a communication circuit configured to communicate with a pin insertion apparatus for inserting the pins into the substrate;
   a plurality of light sources configured to emit pattern light onto a first substrate into which a plurality of first pins is inserted by the pin insertion apparatus;
   an image sensor configured to receive the pattern light reflected from each of the plurality of first pins;
   at least one memory configured to store pin insertion reference information indicating a reference height and a reference position set for each of the plurality of first pins; and
   at least one processor,
   wherein the at least one processor is configured to:
   generate a three-dimensional image for each of the plurality of first pins by using the pattern light reflected from each of the plurality of first pins and received by the image sensor;
   generate pin insertion state information indicating an insertion state of each of the plurality of first pins by using the three-dimensional image;
   detect at least one second pin having an insertion defect from among the plurality of first pins by using at least one of the pin insertion reference information and the pin insertion state information of each of the plurality of first pins;
   generate a control signal for adjusting at least one first process parameter among a plurality of process parameters of the pin insertion apparatus, based on the pin insertion state information for the at least one second pin; and
   control the communication circuit to transmit the control signal to the pin insertion apparatus.

2. The apparatus of claim 1, wherein the pin insertion state information includes information indicating a pin tip height, information indicating a pin shoulder height, information indicating a pin tip position, and information indicating a pin insertion position.

3. The apparatus of claim 1, wherein the plurality of process parameters includes a process parameter for adjusting a pin insertion force, a process parameter for adjusting a pin insertion position, a process parameter for adjusting a pin insertion speed, a process parameter for adjusting a movement speed of a pin insertion head used for pin insertion, and a process parameter for adjusting a position of an anvil.

4. The apparatus of claim 1, wherein the at least one processor is configured to:
identify a reference position of each of the plurality of first pins based on the pin insertion reference information;
identify a pin insertion position of each of the plurality of first pins based on the pin insertion state information;
calculate a difference between the reference position and the pin insertion position of each of the plurality of first pins; and
if at least one pin in which the calculated difference is equal to or greater than a preset first threshold value is detected from among the plurality of first pins, determine the detected at least one pin as the at least one second pin having the insertion defect.

5. The apparatus of claim 4, wherein the at least one processor is configured to:
determine at least one process parameter available for adjusting the difference between the reference position and the pin insertion position of the at least one second pin among the plurality of process parameters, as the at least one first process parameter; and
generate the control signal for adjusting the at least one first process parameter such that the difference between the reference position and the pin insertion position of the at least one second pin becomes less than the first threshold value.

6. The apparatus of claim 1, wherein the at least one processor is configured to:
calculate a difference between a pin tip position and a pin insertion position of each of the plurality of first pins identified based on the pin insertion state information; and
if at least one pin in which the calculated difference is equal to or greater than a preset second threshold value is detected from among the plurality of first pins, determine the detected at least one pin as the at least one second pin having the insertion defect.

7. The apparatus of claim 6, wherein the at least one processor is configured to:
determine at least one process parameter available for adjusting the difference between the reference position and the pin insertion position of the at least one second pin among the plurality of process parameters, as the at least one first process parameter; and
generate the control signal for adjusting the at least one first process parameter such that the difference between the reference position and the pin insertion position of the at least one second pin becomes less than the second threshold value.

8. The apparatus of claim 1, wherein the at least one processor is configured to:
identify a reference height of each of the plurality of first pins based on the pin insertion reference information;
identify a pin tip height of each of the plurality of first pins based on the pin insertion state information;
calculate a difference between the reference height and the pin tip height of each of the plurality of first pins; and
if at least one pin in which the calculated difference is equal to or greater than a preset third threshold value is detected from among the plurality of first pins, determine the detected at least one pin as the at least one second pin having the insertion defect.

9. The apparatus of claim 8, wherein the at least one processor is configured to:
determine at least one process parameter available for adjusting the difference between the reference height and the pin tip height of the at least one second pin among the plurality of process parameters, as the at least one first process parameter; and
generate the control signal for adjusting the at least one first process parameter such that the difference between the reference height and the pin tip height of the at least one second pin becomes less than the third threshold value.

10. The apparatus of claim 1, wherein the at least one processor is configured to:
calculate a shoulder coplanarity of each of the plurality of first pins by using a pin shoulder height of each of the plurality of first pins identified based on the pin insertion state information; and
if at least one pin in which the calculated shoulder coplanarity is equal to or greater than a preset fourth threshold value is detected from among the plurality of first pins, determine the detected at least one pin as the at least one second pin having the insertion defect.

11. The apparatus of claim 10, wherein the at least one processor is configured to:
determine at least one process parameter available for adjusting the shoulder coplanarity of the at least one second pin among the plurality of process parameters, as the at least one first process parameter; and
generate the control signal for adjusting the at least one first process parameter such that the shoulder coplanarity of the at least one second pin becomes less than the fourth threshold value.

12. A method for inspecting insertion states of a plurality of pins inserted into a substrate by a substrate inspection apparatus, comprising:
emitting pattern light onto a first substrate into which a plurality of first pins is inserted by a pin insertion apparatus;
receiving the pattern light reflected from each of the plurality of first pins;
generating a three-dimensional image for each of the plurality of first pins by using the pattern light reflected and received from each of the plurality of first pins;
generating pin insertion state information indicating an insertion state of each of the plurality of first pins by using the three-dimensional image;
detecting at least one second pin having an insertion defect from among the plurality of first pins by using at least one of pin insertion reference information indicating a reference height and a reference position set for each of the plurality of first pins and the pin insertion state information of each of the plurality of first pins;
generating a control signal for adjusting at least one first process parameter among a plurality of process parameters of the pin insertion apparatus, based on the pin insertion state information for the at least one second pin; and
transmitting the control signal to the pin insertion apparatus.

13. The method of claim 12, wherein the step of detecting at least one second pin having the insertion defect includes:
identifying a reference position of each of the plurality of first pins based on the pin insertion reference information;

identifying a pin insertion position of each of the plurality of first pins based on the pin insertion state information;

calculating a difference between the reference position and the pin insertion position of each of the plurality of first pins; and if at least one pin in which the calculated difference is equal to or greater than a preset first threshold value is detected from among the plurality of first pins, determining the detected at least one pin as the at least one second pin having the insertion defect.

14. The method of claim 13, wherein the step of generating the control signal for adjusting at least one first process parameter includes:

determining at least one process parameter available for adjusting the difference between the reference position and the pin insertion position of the at least one second pin among the plurality of process parameters, as the at least one first process parameter; and generating the control signal for adjusting the at least one first process parameter such that the difference between the reference position and the pin insertion position of the at least one second pin becomes less than the first threshold value.

15. The method of claim 12, wherein the step of detecting at least one second pin having the insertion defect includes:

calculating a difference between a pin tip position and a pin insertion position of each of the plurality of first pins identified based on the pin insertion state information; and if at least one pin in which the calculated difference is equal to or greater than a preset second threshold value is detected from among the plurality of first pins, determining the detected at least one pin as the at least one second pin having the insertion defect.

16. The method of claim 15, wherein the step of generating the control signal for adjusting at least one first process parameter includes:

determining at least one process parameter available for adjusting the difference between the pin tip position and the pin insertion position of the at least one second pin among the plurality of process parameters, as the at least one first process parameter; and generating the control signal for adjusting the at least one first process parameter such that the difference between the pin tip position and the pin insertion position of the at least one second pin becomes less than the second threshold value.

17. The method of claim 12, wherein the step of detecting at least one second pin having the insertion defect includes:

identifying a reference height of each of the plurality of first pins based on the pin insertion reference information;

identifying a pin tip height of each of the plurality of first pins based on the pin insertion state information;

calculating a difference between the reference height and the pin tip height of each of the plurality of first pins; and if at least one pin in which the calculated difference is equal to or greater than a preset third threshold value is detected from among the plurality of first pins, determining the detected at least one pin as the at least one second pin having the insertion defect.

18. The method of claim 17, wherein the step of generating the control signal for adjusting at least one first process parameter includes:

determining at least one process parameter available for adjusting the difference between the reference height and the pin tip height of the at least one second pin among the plurality of process parameters, as the at least one first process parameter; and generating the control signal for adjusting the at least one first process parameter such that the difference between the reference height and the pin tip height of the at least one second pin becomes less than the third threshold value.

19. The method of claim 12, wherein the step of detecting at least one second pin having the insertion defect includes:

calculating a shoulder coplanarity of each of the plurality of first pins by using a pin shoulder height of each of the plurality of first pins identified based on the pin insertion state information; and if at least one pin in which the calculated shoulder coplanarity is equal to or greater than a preset fourth threshold value is detected from among the plurality of first pins, determining the detected at least one pin as the at least one second pin having the insertion defect.

20. The method of claim 19, wherein the step of generating the control signal for adjusting at least one first process parameter includes:

determining at least one process parameter available for adjusting the shoulder coplanarity of the at least one second pin among the plurality of process parameters, as the at least one first process parameter; and generating the control signal for adjusting the at least one first process parameter such that the shoulder coplanarity of the at least one second pin becomes less than the fourth threshold value.

* * * * *